(12) United States Patent
Furuichi et al.

(10) Patent No.: US 10,262,932 B2
(45) Date of Patent: Apr. 16, 2019

(54) WIRING BOARD, AND SEMICONDUCTOR DEVICE

(71) Applicant: SHINKO ELECTRIC INDUSTRIES CO., LTD., Nagano-shi, Nagano (JP)

(72) Inventors: Jun Furuichi, Nagano (JP); Noriyoshi Shimizu, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 16 days.

(21) Appl. No.: 15/441,551

(22) Filed: Feb. 24, 2017

(65) Prior Publication Data
US 2017/0256482 A1    Sep. 7, 2017

(30) Foreign Application Priority Data

Mar. 1, 2016 (JP) .................. 2016-038876

(51) Int. Cl.
*H01L 23/498*     (2006.01)
*H01L 21/48*      (2006.01)
(Continued)

(52) U.S. Cl.
CPC ...... *H01L 23/49838* (2013.01); *H01L 21/486* (2013.01); *H01L 21/4857* (2013.01); *H01L 21/56* (2013.01); *H01L 21/6835* (2013.01); *H01L 23/3121* (2013.01); *H01L 23/49822* (2013.01); *H01L 23/49827* (2013.01); *H01L 23/5383* (2013.01); *H01L 23/5384* (2013.01); *H01L 23/5386* (2013.01); *H01L 24/17* (2013.01); *H01L 24/81* (2013.01); *H01L 21/568* (2013.01); *H01L 23/49894* (2013.01); *H01L 2221/68345* (2013.01); *H01L 2221/68359* (2013.01); *H01L 2224/13014* (2013.01); *H01L 2224/13144* (2013.01); *H01L 2224/16113* (2013.01); *H01L 2224/16238* (2013.01);
(Continued)

(58) Field of Classification Search
None
See application file for complete search history.

(56) References Cited

U.S. PATENT DOCUMENTS 9,220,167 B2 * 12/2015 Shimizu ............... H05K 1/0298
9,232,642 B2 *  1/2016 Nakamura ........... H01L 23/145
(Continued)

FOREIGN PATENT DOCUMENTS

JP      2015-191968       11/2015

*Primary Examiner* — Abul Kalam
(74) *Attorney, Agent, or Firm* — Rankin, Hill & Clark LLP

(57) ABSTRACT

A wiring board includes: a first wiring structure including: a first insulating layer; a first wiring layer; and a via wiring; a protective insulating layer formed on the lower surface of the first insulating layer to cover a side surface of a lower portion of the first wiring layer; and a second wiring structure having an insulating layer and a wiring layer and formed on the upper surface of the first insulating layer. The upper surface of the first insulating layer and the upper end surface of the via wiring are substantially flush with each other. A wiring density of the second wiring structure is higher than a wiring density of the first wiring structure. The reinforcing material is positioned on a side of the second wiring structure with respect to a center of the first insulating layer in the thickness direction of the first insulating layer.

9 Claims, 11 Drawing Sheets

(51) Int. Cl.
*H01L 21/56* (2006.01)
*H01L 21/683* (2006.01)
*H01L 23/31* (2006.01)
*H01L 23/00* (2006.01)
*H01L 23/538* (2006.01)

(52) U.S. Cl.
CPC .............. *H01L 2224/16501* (2013.01); *H01L 2224/81005* (2013.01); *H01L 2224/81193* (2013.01); *H01L 2224/81815* (2013.01); *H01L 2924/014* (2013.01); *H01L 2924/0105* (2013.01); *H01L 2924/01022* (2013.01); *H01L 2924/01024* (2013.01); *H01L 2924/01028* (2013.01); *H01L 2924/01029* (2013.01); *H01L 2924/01046* (2013.01); *H01L 2924/01047* (2013.01); *H01L 2924/01073* (2013.01); *H01L 2924/01079* (2013.01); *H01L 2924/04941* (2013.01); *H01L 2924/04953* (2013.01); *H01L 2924/05432* (2013.01); *H01L 2924/05442* (2013.01); *H01L 2924/0665* (2013.01); *H01L 2924/1432* (2013.01); *H01L 2924/1436* (2013.01); *H01L 2924/1437* (2013.01); *H01L 2924/1438* (2013.01); *H01L 2924/1579* (2013.01); *H01L 2924/15313* (2013.01); *H01L 2924/15747* (2013.01); *H01L 2924/15787* (2013.01); *H01L 2924/18161* (2013.01)

(56) References Cited

U.S. PATENT DOCUMENTS

| | | | |
|---|---|---|---|
| 2009/0236135 A1* | 9/2009 | Ueda | H05K 3/4602 174/260 |
| 2012/0234589 A1* | 9/2012 | Furuichi | H05K 3/4682 174/261 |
| 2013/0264101 A1* | 10/2013 | Furuichi | H05K 1/115 174/251 |
| 2014/0021625 A1* | 1/2014 | Nakamura | H01L 23/145 257/773 |
| 2015/0179560 A1* | 6/2015 | Arisaka | H05K 1/0366 257/777 |
| 2015/0181703 A1* | 6/2015 | Tanaka | H05K 1/0298 361/748 |
| 2015/0245473 A1* | 8/2015 | Shimizu | H05K 1/0298 257/778 |
| 2015/0282307 A1 | 10/2015 | Shimizu et al. | |
| 2016/0020163 A1* | 1/2016 | Shimizu | H01L 23/49822 361/768 |
| 2017/0352628 A1* | 12/2017 | Furuichi | H01L 23/562 |

* cited by examiner

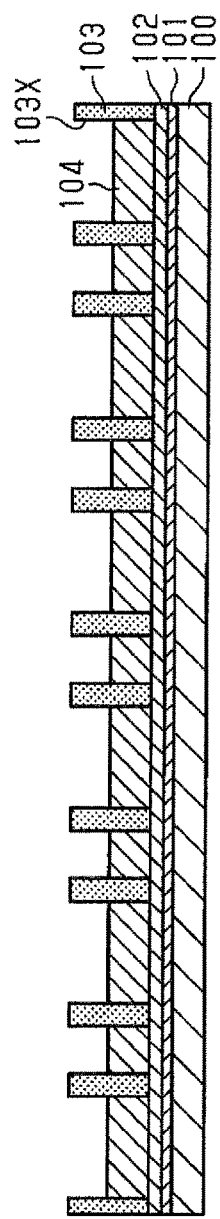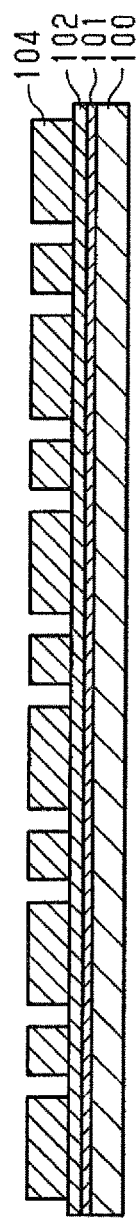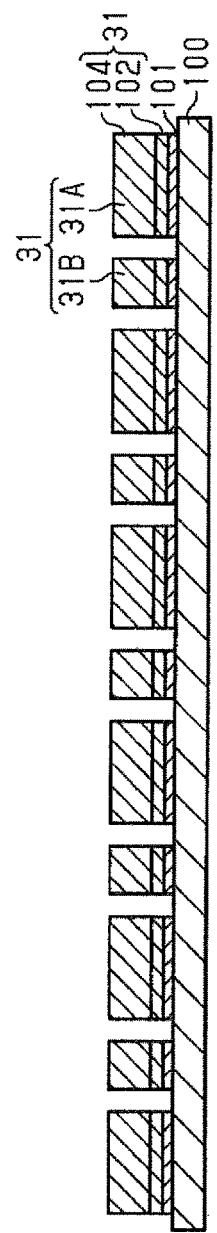

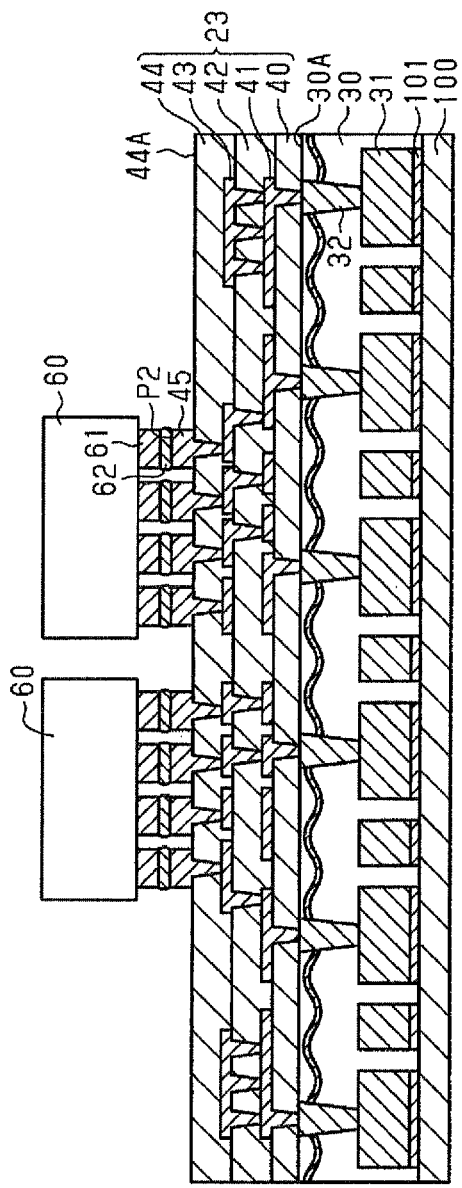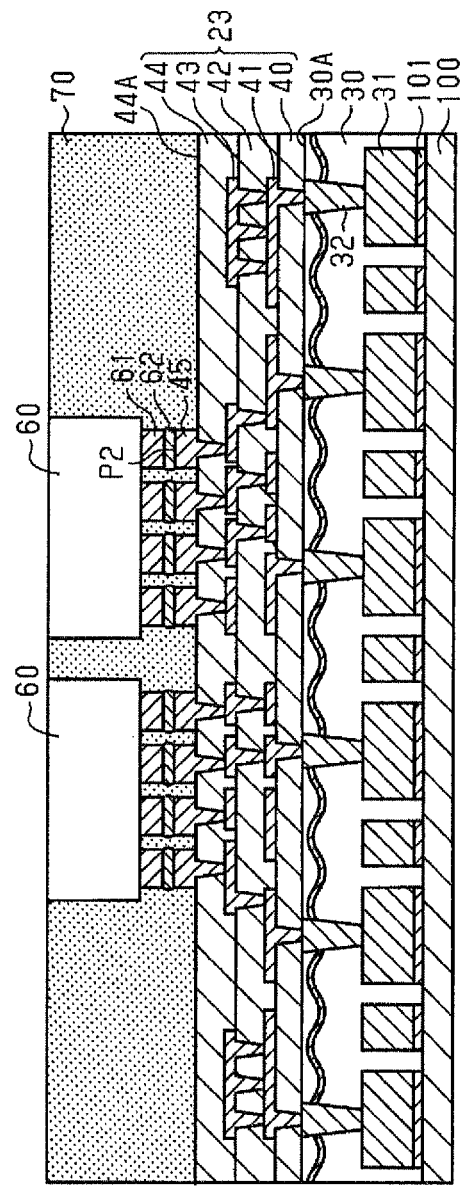
FIG. 7A
FIG. 7B

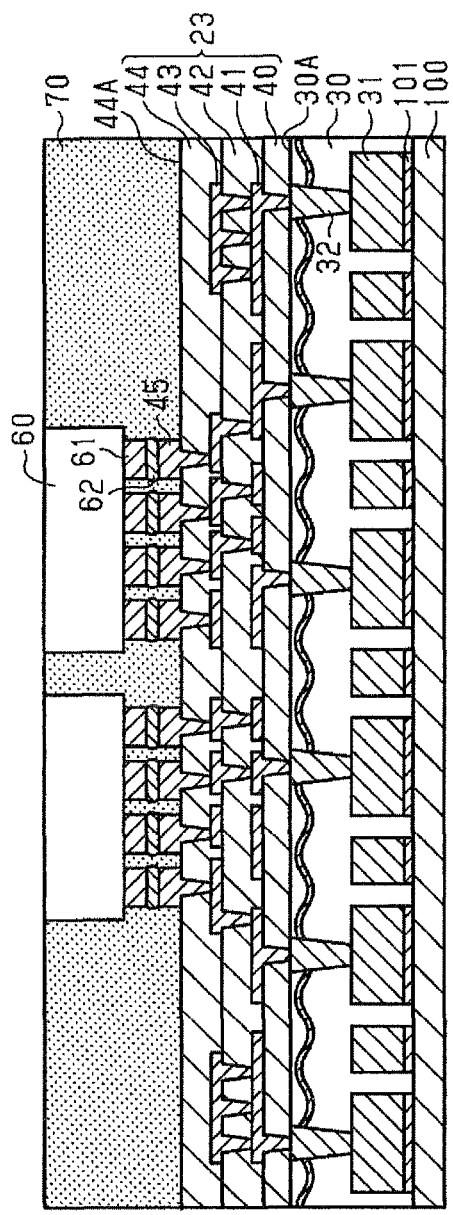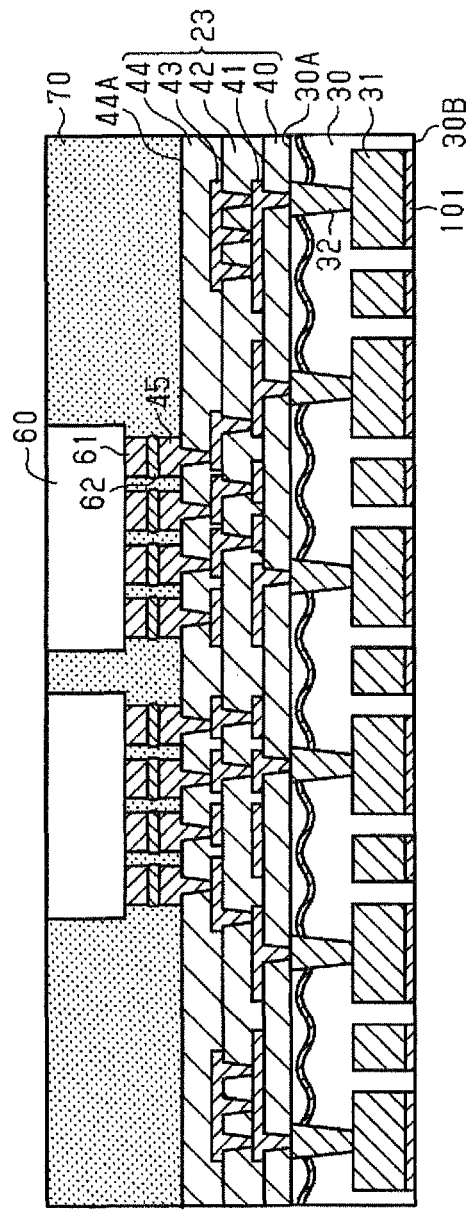
FIG. 8A
FIG. 8B

US 10,262,932 B2

WIRING BOARD, AND SEMICONDUCTOR DEVICE

This application claims priority from Japanese Patent Application No. 2016-038876, filed on Mar. 1, 2016, the entire contents of which are herein incorporated by reference.

BACKGROUND

1. Technical Field

The present disclosure relates to a wiring board, and a semiconductor device.

2. Description of the Related Art

A wiring board in which a plurality of wiring layers and a plurality of insulating layers are formed alternately by a buildup method in order to increase a density of a wiring pattern has been heretofore known as a wiring board on which an electronic component such as a semiconductor chip is mounted. As this type of wiring board, a wiring board in which a high-density wiring layer including insulating layers made of a photosensitive resin is formed on a low-density wiring layer including insulating layers made of a thermosetting resin has been proposed (e.g. see JP-A-2015-191968).

FIG. 13 shows an example of a related-art wiring board. The wiring board 200 has a low-density wiring layer 201, a solder resist layer 202 which is formed on a lower surface of the low-density wiring layer 201, and a high-density wiring layer 203 which is formed on an upper surface of the low-density wiring layer 201. The low-density wiring layer 201 has a structure in which a wiring layer 211, an insulating layer 212, a wiring layer 213, an insulating layer 214, a wiring layer 215, and an insulating layer 216 are formed in the named order. Each of the insulating layers 212, 214 and 216 is made of an insulating resin containing a thermosetting resin as a main component. The high-density wiring layer 203 has a structure in which a wiring layer 220, an insulating layer 221, a wiring layer 222, an insulating layer 223, a wiring layer 224, an insulating layer 225, and a wiring layer 226 are formed on an upper surface of the insulating layer 216 in the named order. Each of the insulating layers 221, 223 and 225 is made of an insulating resin containing a photosensitive resin as a main component.

Since a core substrate (support substrate) having high rigidity and thicker than the insulating layer 212, 214 or 216 etc. is not provided in such a wiring substrate 200, the wiring board 200 as a whole can be made thin.

In the wiring board 200, for example, the wiring layer 211, the insulating layer 212, and the solder resist layer 202 differ from one another in thermal expansion coefficient. Moreover, in the wiring board 200, the wiring layer 211 is formed on a lower surface of the insulating layer 212, and an interface between the insulating layer 212 and the solder resist layer 202 is present in corner portions A2 of the wiring layer 211. When thermal stress occurs in such a wiring board 200 due to heating treatment etc., stress is concentrated in the vicinities of the corner portions A2 of the wiring layer 211 and cracking etc. occurs easily in respective interfaces among the wiring layer 211, the insulating layer 212 and the solder resist layer 202.

SUMMARY

According to one or more aspects of the present disclosure, there is provided a wiring board. The wiring board comprises:

a first wiring structure comprising:
    a first insulating layer made of an insulating resin including a reinforcing material;
    a recess formed in a lower surface of the first insulating layer;
    a first wiring layer having an upper portion filling the recess and a lower portion protruding downward from the lower surface of the first insulating layer;
    a via wiring having an upper end surface exposed from an upper surface of the first insulating layer, wherein the via wiring penetrates the first insulating layer in a thickness direction of the first insulating layer to be connected to the first wiring layer;
    a protective insulating layer formed on the lower surface of the first insulating layer to cover a side surface of a lower portion of the first wiring layer; and
a second wiring structure having an insulating layer and a wiring layer and formed on the upper surface of the first insulating layer.

The upper surface of the first insulating layer and the upper end surface of the via wiring are substantially flush with each other.

A wiring density of the second wiring structure is higher than a wiring density of the first wiring structure.

The reinforcing material is positioned on a side of the second wiring structure with respect to a center of the first insulating layer in the thickness direction of the first insulating layer.

BRIEF DESCRIPTION OF THE DRAWINGS

FIGS. 3A to 3D are schematic sectional views showing a method for manufacturing the semiconductor device according to the embodiment;

FIGS. 7A and 7B are schematic sectional views showing the method for manufacturing the semiconductor device according to the embodiment;

FIGS. 8A and 8B are schematic sectional views showing the method for manufacturing the semiconductor device according to the embodiment;

DETAILED DESCRIPTION

Figure 1:
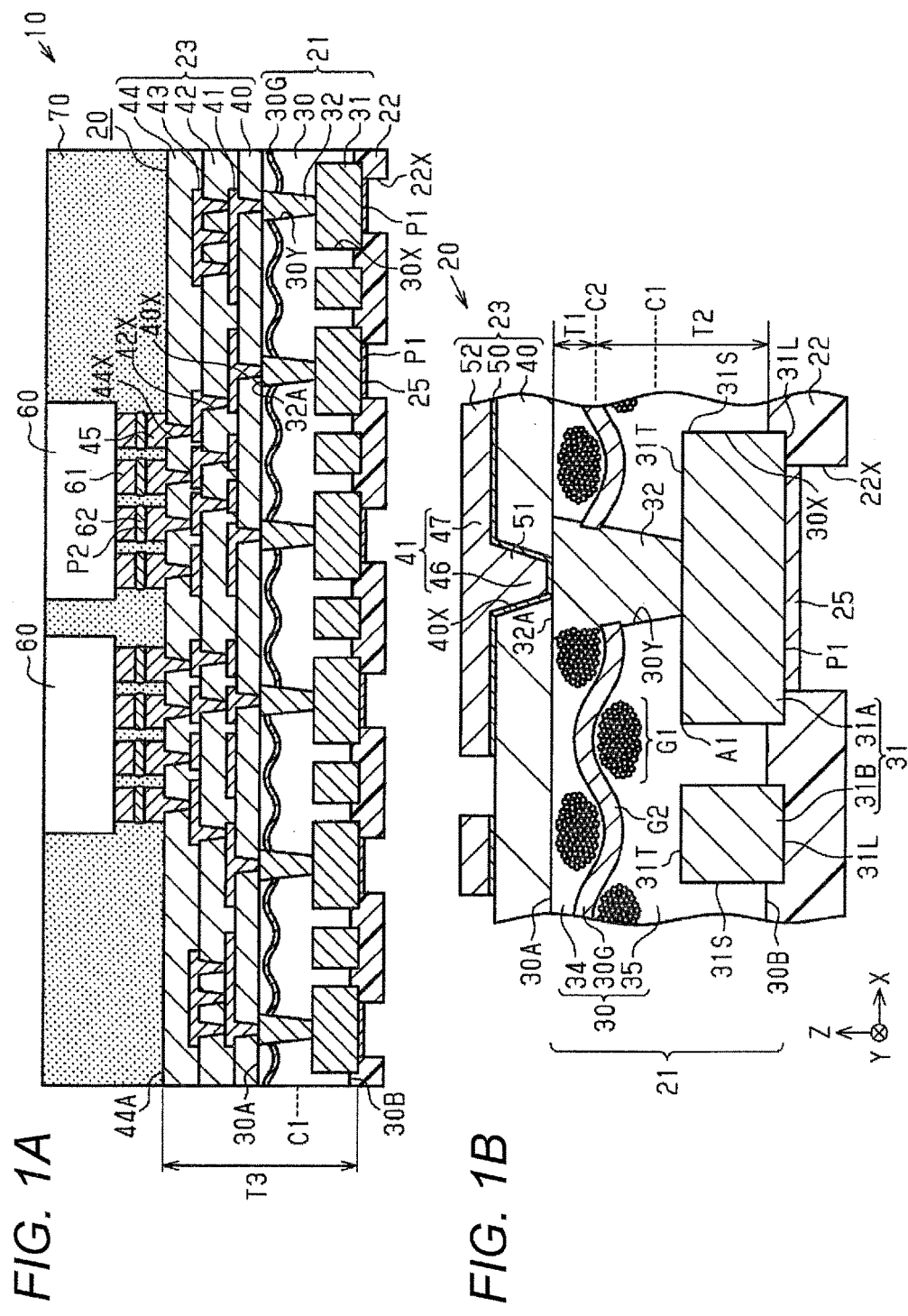
FIG. 1A is a substantially sectional view (sectional view taken along a line 1a-1a in FIG. 2) showing a semiconductor device according to an embodiment.
FIG. 1B is an enlarged sectional view in which a portion of the semiconductor device shown in FIG. 1A is enlarged.

An embodiment will be described below with reference to the accompanying drawings.

Incidentally, for convenience's sake, a portion regarded as a characteristic may be enlarged and shown in the accompanying drawings in order to make the characteristic easy to understand, but dimension ratios etc. of respective constituent elements are not always exactly the same as practical ones. In addition, in sectional views, in order to make sectional structures of respective members easy to understand, hatchings of some of the members are replaced by matt patterns and shown, and others of the members are not hatched.

As shown in FIG. 1A, a semiconductor device 10 has a wiring board 20, one semiconductor chip or a plurality of (two in this case) semiconductor chips 60 which are mounted on the wiring board 20, and a sealing resin 70 with which a portion or portions of the semiconductor chip or chips 60 are covered.

The wiring board 20 has a wiring structure 21, a solder resist layer 22 which is formed on a lower side of the wiring structure 21, and a wiring structure 23 which is formed on an upper side of the wiring structure 21.

First, the structure of the wiring structure 21 will be described.

The wiring structure 21 is a low-density wiring layer in which a wiring layer lower in wiring density than the wiring structure 23 is formed. The wiring structure 21 has an insulating layer 30, a wiring layer 31, and via wirings 32 which penetrate the insulating layer 30 in a thickness direction.

Here, for example, a thermosetting insulating resin which contains a reinforcing material can be used as the material of the insulating layer 30. For example, a so-called glass epoxy resin can be used as the material of the insulating layer 30. The glass epoxy resin is formed by impregnating a glass cloth (glass woven fabric) with a thermosetting insulating resin containing an epoxy resin as a main component, and then hardening the thermosetting insulating resin. The glass cloth serves as the reinforcing material. The thermosetting insulating resin is not limited to the epoxy resin. For example, an insulating resin such as a polyimide resin or a cyanate resin can be used. The insulating layer 30 may contain a filler which is, for example, made of silica, alumina, etc.

As shown in FIG. 1B, the insulating layer 30 has a required number of glass cloths 30G (one glass cloth 30G in this case), a resin layer 34 which covers an upper surface of the glass cloth 30G, and a resin layer 35 which covers a lower surface of the glass cloth 30G. Entire surfaces of the glass cloth 30G in this example are covered with the resin layers 34 and 35. That is, the glass cloth 30G in this example is not exposed in an upper surface 30A of the insulating layer 30.

For example, the glass cloth 30G has a form in which glass fiber bundles G1 arranged in parallel in an X direction and glass fiber bundles G2 arranged in parallel in a Y direction are plainly woven into a grid pattern. In each of the glass fiber bundles G1 and G2, a plurality of glass fibers each having a glass fiber diameter of, for example, about 1 to 2 µm are bundled. A thickness of the glass fiber bundle G1, G2 can be set, for example, in a range of about 15 to 20 µm. In addition, an entire sectional shape of the glass fiber bundle G1, G2 made up of the plurality of glass fibers is not limited particularly. For example, the entire sectional shape of the glass fiber bundle G1, G2 may be elliptic or circular.

Incidentally, in addition to the glass cloth 30G using the glass fiber bundles G1 and G2, woven fabric or non-woven fabric using carbon fiber bundles, polyester fiber bundles, nylon fiber bundles, aramid fiber bundles, liquid crystal polymer fiber bundles, etc. may be used as the reinforcing material. In addition, the method of weaving the fiber bundles is not limited to a plain weave but may include a satin weave, a twill weave, etc.

Inside the insulating layer 30, the glass cloth 30G is positioned on a wiring structure 23 side (upper side) with respect to a thicknesswise center C1 of the insulating layer 30. Specifically, a thicknesswise center C2 of the glass cloth 30G is disposed in a position closer to the wiring structure 23 side than the thicknesswise center C1 of the insulating layer 30. To give detailed explanation, a thickness T1 of the resin layer 34 (specifically, a thickness between the upper surface 30A of the insulating layer 30 and the center C2) is set to be thinner than a thickness T2 of the resin layer 35 (specifically, a thickness between the center C2 and a lower surface 30B of the insulating layer 30) in the insulating layer 30. In this manner, the glass cloth 30G high in rigidity is provided to be closer to the wiring structure 23 side than the center C1. Accordingly, the position of the glass cloth 30G can be made close to a thicknesswise center of the wiring board 20. Thus, when the wiring board 20 is seen in an up/down direction (thickness direction), the wiring board 20 can approximate to a vertically symmetric structure with respect to the glass cloth 30G. As a result, the wiring board 20 can be formed to have a structure strong against warping.

Further, the glass cloth 30G in this example is provided and disposed in the vicinity of the thicknesswise center of the entire wiring board 20. Specifically, as shown in FIG. 1A, the glass cloth 30G is provided to be positioned in the thicknesswise center in a thickness T3 between a lower surface of the wiring layer 31 and an upper surface 44A of an uppermost insulating layer 44 of the wiring structure 23. For example, in the wiring board 20, the thickness T1 of the resin layer 34 and the thickness T2 of the resin layer 35 are set as shown in FIG. 1B so that the glass cloth 30G can be provided and disposed in the vicinity of the thicknesswise center in the thickness T3. For example, the thickness T1 of the resin layer 34 can be set to be about ½ to ⅓ as thick as the resin layer 35. The thickness T1 of the resin layer 34 can be set, for example, in a range of about 10 to 15 µm. The thickness T2 of the resin layer 35 can be set, for example, in a range of about 20 to 25 µm. Incidentally, a thickness between the upper surface 30A and the lower surface 30B of the insulating layer 30 can be set, for example, in a range of about 30 to 40 µm.

A plurality of recesses 30X are formed at required places in the lower surface 30B of the insulating layer 30 to be recessed toward the upper surface 30A of the insulating layer 30. Each of the recesses 30X is formed to extend from the lower surface 30B of the insulating layer 30 to a thicknesswise middle position of the insulating layer 30. That is, the recess 30X is formed so that the bottom of the recess 30X can come to the thicknesswise middle position of the insulating layer 30. Incidentally, a depth of the recess 30X can be set, for example, in a range of about 12 to 20 µm.

The wiring layer 31 is formed inside the respective recesses 30X. The wiring layer 31 has an upper surface 31T, a lower surface 31L, and a side surface 31S which is formed between the upper surface 31T and the lower surface 31L. The wiring layer 31 is formed so that a portion of the wiring layer 31 is embedded in the insulating layer 30. Specifically, the upper surface 31T of the wiring layer 31 is formed in the bottoms of the recesses 30X. In addition, an upper portion of the wiring layer 31, i.e. the upper surface 31T of the wiring layer 31 and the side surface 31S of an upper side of the wiring layer 31 are covered with the insulating layer 30. The upper portion of the wiring layer 31 fills the recesses 30X. A lower portion of the wiring layer 31, i.e. the lower surface 31L of the wiring layer 31 and the side surface 31S of a lower side of the wiring layer 31 are exposed from the insulating layer 30. That is, the lower portion of the wiring layer 31 is formed to protrude downward from the lower surface 30B of the insulating layer 30. In other words, the insulating layer 30 is formed to contact the entire upper surface 31T of the wiring layer 31 and the side surface 31S of the upper portion of the wiring layer 31 and cover the entire upper surface 31T of the wiring layer 31 and the side surface 31S of the upper portion of the wiring layer 31. In addition, the insulating layer 30 is formed to expose the entire lower surface 31L of the wiring layer 31 and the side surface 31S of the lower portion of the wiring layer 31.

A thickness of the wiring layer 31 can be set, for example, in a range of about 15 to 22 µm. A protrusion amount of the wiring layer 31 from the lower surface 30B of the insulating layer 30 (i.e. a thickness between the lower surface 30B of the insulating layer 30 and the lower surface 31L of the wiring layer 31) can be set, for example, in a range of about 2 to 3 µm. The line-and-space (L/S) of the wiring layer 31 can be set, for example, at about 20 µm/20 µm. Here, the line-and-space (L/S) expresses each line width and each internal between adjacent lines. Incidentally, for example, copper or a copper alloy can be used as the material of the wiring layer 31.

For example, the wiring layer 31 has a plurality of wiring patterns 31A connected to the via wirings 32, and a plurality of conductor patterns 31B formed in a region where the wiring patterns 31A are not formed (disposed). For example, each of the wiring patterns 31A serves as an external connection pad P1 to which an external connection terminal can be connected. The external connection terminal is used when the semiconductor device 10 is mounted on a mount board such as a motherboard. For example, each of the conductor patterns 31B may be formed solidly as a dummy pattern. In addition, when the conductor pattern 31B is a dummy pattern, for example, the conductor pattern 31B is not electrically connected to the via wirings 32 right above the wiring layer 31 but electrically isolated (floated) from the via wirings 32. In addition, the conductor pattern 31B may be, for example, a wiring pattern for wiring. When the conductor pattern 31B is a wiring pattern, for example, the conductor pattern 31B is electrically connected to the external connection pad P1.

Figure 2:
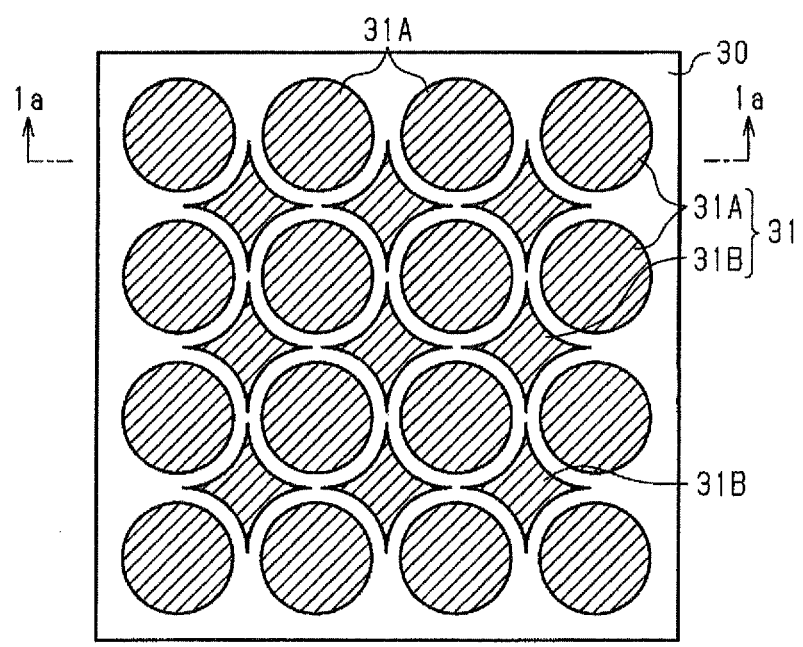
FIG. 2 is a schematic plan view showing a wiring board according to the embodiment.

FIG. 2 shows a plan view when the conductor patterns 31B are the dummy patterns. As shown in FIG. 2, for example, the wiring patterns 31A are disposed in a matrix form in plan view. Each of the conductor patterns 31B is formed, for example, between adjacent ones of the wiring patterns 31A. Each wiring pattern 31A and each conductor pattern 31B can be formed into any planar shapes and with any sizes. For example, the planar shape of the wiring pattern 31A can be formed as a circular shape having a diameter of about 200 to 400 µm. In addition, for example, the planar shape of the conductor pattern 31B can be formed as a diamond shape. Incidentally, FIG. 2 is a plan view of the wiring board 20 shown in FIG. 1A as seen from below. In FIG. 2, the solder resist layer 22 is illustrated transparently.

As shown in FIG. 1B, through holes 30Y which are provided as openings at required places in the upper surface 30A to penetrate the insulating layer 30 in the thickness direction to thereby expose portions of the upper surface 31T of the wiring layer 31 are formed in the insulating layer 30. Each of the through holes 30Y is formed into a tapered shape whose diameter is gradually smaller from the upper side (wiring structure 23 side) toward the lower side (wiring layer 31 side) in FIG. 1B. For example, the through hole 30Y is formed substantially into an inverted truncated conical shape in which an opening diameter of a lower-side opening end is smaller than an opening diameter of an upper-side opening end. For example, the opening diameter of the upper-side opening end of the through hole 30Y can be set in a range of about 50 to 100 µm.

The upper surface 30A of the insulating layer 30 is a smooth surface (low roughness surface) with small unevenness. For example, the upper surface 30A of the insulating layer 30 is a polished surface. For example, the upper surface 30A of the insulating layer 30 is smaller in surface roughness than an inner side surface of the through hole 30Y. Roughness of the upper surface 30A of the insulating layer 30 is set, for example, to be about 15 to 40 nm in terms of surface roughness Ra value. In addition, the roughness of the inner side surface of the through hole 30Y is set, for example, to be about 300 to 400 nm in terms of surface roughness Ra value. Here, the surface roughness Ra value is called arithmetic average roughness, which is a kind of numerical value expressing surface roughness. Specifically, the surface roughness Ra value is calculated as follows. That is, heights varying within a measurement region are measured from a surface corresponding to an average line, and absolute values of the measured heights are arithmetically averaged.

The via wirings 32 connected to the wiring layer 31 are formed inside the through holes 30Y. The via wirings 32 are formed to penetrate the insulating layer 30 in the thickness direction. The via wirings 32 in this example fill the through holes 30Y. Therefore, similarly to each of the through holes 30Y, each of the via wirings 32 is formed substantially into an inverted truncated conical shape in which an upper end surface 32A is larger than a lower end surface.

The upper end surface 32A of the via wiring 32 is exposed from the upper surface 30A of the insulating layer 30. For example, the upper end surface 32A of the via wiring 32 is formed to be substantially flush with the upper surface 30A of the insulating layer 30. The upper end surface 32A of the via wiring 32 is a smooth surface (low roughness surface) with small unevenness, similarly to the upper surface 30A of the insulating layer 30. For example, the upper end surface 32A of the via wiring 32 is a polished surface. Roughness of the upper end surface 32A of the via wiring 32 is set, for example, to be about 15 to 40 nm in terms of surface roughness Ra value.

The lower end surface of the via wiring 32 is directly connected to a portion of the upper surface 31T of the wiring layer 31. That is, the portion of the upper surface 31T of the wiring layer 31 and the lower end surface of the via wiring 32 contact each other so that the wiring layer 31 and the via wiring 32 are electrically connected to each other. In other words, the wiring layer 31 and the via wiring 32 are electrically connected to each other, but they are formed not integrally but separately. Incidentally, for example, copper or a copper alloy can be used as the material of the via wiring 32.

The solder resist layer 22 is formed on the lower surface 30B of the insulating layer 30 to cover the wiring layer 31.

The solder resist layer 22 is a protective insulating layer which is formed as an outermost layer (lowermost layer in this case) in the wiring board 20.

The solder resist layer 22 is formed to cover the entire side surface 31S of the lower portion of the wiring layer 31 exposed from the insulating layer 30. In other words, the side surface 31S of the upper portion of the wiring layer 31 is covered with the insulating layer 30, and the side surface 31S of the lower portion of the wiring layer 31 is covered with the solder resist layer 22. That is, an interface between the insulating layer 30 and the solder resist layer 22 is formed on a plane (an XY plane) where a portion of the side surface 31S of the wiring layer 31 is formed.

In addition, the solder resist layer 22 is formed, for example, to cover the lower surface 31L corresponding to portions of the wiring patterns 31A. The solder resist layer 22 is formed, for example, to cover the lower surface 31L corresponding to the entire conductor patterns 31B.

Opening portions 22X for exposing portions of the lowermost wiring layer 31 (specifically, the wiring patterns 31A) as the external connection pads P1 are formed in the solder resist layer 22.

If occasions demand, a surface treatment layer 25 is formed on the wiring patterns 31A (i.e. on the external connection pads P1) exposed from the opening portions 22X. An OSP (Organic Solderability Preservative) film which is formed by applying antioxidant treatment such as OSP treatment etc. on front surfaces of the external connection pads P1 can be used as an example of the surface treatment layer 25. An organic coating made of an azole compound, an imidazole compound etc. can be used as the OSP film. In addition, a gold (Au) layer, a nickel (Ni) layer/Au layer (a metal layer in which an Ni layer and an Au layer are formed in the named order), an Ni layer/palladium (Pd) layer/Au layer (a metal layer in which an Ni layer, a Pd layer and an Au layer are formed in the named order), etc. can be enumerated as other examples of the surface treatment layer 25. Here, the Au layer is a metal layer made of Au or an Au alloy. The Ni layer is a metal layer made of Ni or an Ni alloy. The Pd layer is a metal layer made of Pd or a Pd alloy. For example, a metal layer (electroless plating metal layer) formed by electroless plating can be used as each of the Ni layer, the Au layer and the Pd layer. Incidentally, the wiring patterns 31A per se exposed from the opening portions 22X (or the surface treatment layer 25 when the surface treatment layer 25 is formed on the wiring patterns 31A) may be used as the external connection terminals.

Each opening portion 22X and each external connection pad P1 can be formed into any planar shapes and with any sizes. For example, the planar shape of the opening portion 22X and the planar shape of the external connection pad P1 can be formed as circular shapes each having a diameter of about 100 to 150 μm. Moreover, a pitch between adjacent ones of the external connection pads P1 can be set, for example, in a range of about 200 to 300 μm.

Next, the structure of the wiring structure 23 will be described.

As shown in FIG. 1A, the wiring structure 23 is a wiring structure formed on the upper surface 30A of the insulating layer 30. The wiring structure 23 is a high-density wiring layer in which wiring layers higher in wiring density than that in the wiring structure 21 are formed.

The wiring structure 23 has a structure in which an insulating layer 40 formed on the upper surface 30A of the insulating layer 30, a wiring layer 41, an insulating layer 42, a wiring layer 43, an insulating layer 44, and a wiring layer 45 are formed in the named order.

Here, for example, an insulating resin which contains a photosensitive resin such as a phenol-based resin or a polyimide-based resin as a main component can be used as the material of each of the insulating layers 40, 42 and 44. For example, the insulating layer 40, 42, 44 may contain a filler made of silica, alumina, etc. For example, copper or a copper alloy can be used as the material of each of the wiring layers 41, 43 and 45.

Each of the insulating layers 40, 42 and 44 is an insulating layer thinner than the insulating layer 30 inside the wiring structure 21. A thickness of the insulating layer 40, 42, 44 can be set, for example, in a range of about 3 to 10 μm. Each of the wiring layers 41, 43 and 45 is a wiring layer thinner than the wiring layer 31 of the wiring structure 21. A thickness of the wiring layer 41, 43 formed on the insulating layer 40, 42 can be set, for example, in a range of about 1 to 5 μm. A thickness of the wiring layer 45 formed on the insulating layer 44 can be set, for example, in a range of about 5 to 10 μm. Each line width and each interval between adjacent lines in the wiring layer 41, 43, 45 are smaller than the line width and the interval between adjacent lines in the wiring layer 31 inside the wiring structure 21. The line-and-space (L/S) of the wiring layer 41, 43, 45 can be set, for example, at about 2 μm/2 μm to 3 μm/3 μm.

The insulating layer 40 is formed on the upper surface 30A of the insulating layer 30 so as to cover the upper end surfaces 32A of the via wirings 32. Through holes 40X are formed at required places in the insulating layer 40 to penetrate the insulating layer 40 in the thickness direction to thereby expose portions of the upper end surfaces 32A of the via wirings 32.

As shown in FIG. 1B, the wiring layer 41 is formed on an upper surface of the insulating layer 40. The wiring layer 41 is electrically connected to the via wirings 32. The wiring layer 41 has via wirings 46 which fill the through holes 40X, and wiring patterns 47 which are formed on the upper surface of the insulating layer 40. Lower end surfaces of the via wirings 46 are directly connected to the portions of the upper end surfaces 32A of the via wirings 32. That is, the portions of the upper end surfaces 32A of the via wirings 32 and the lower end surfaces of the via wirings 46 contact each other respectively, and the via wirings 32 and the via wirings 46 are electrically connected to each other respectively. In other words, although the via wirings 32 and the via wirings 46 are electrically connected to each other respectively, they are formed not integrally but separately.

For example, each of the via wirings 46 has a seed layer 50 covering an inner surface of a corresponding one of the through holes 40X, and a metal layer 51 formed in the corresponding through hole 40X on an inner side than the seed layer 50. For example, each of the wiring patterns 47 has the seed layer 50 formed on the upper surface of the insulating layer 40, and a metal layer 52 formed on the seed layer 50 and the metal layer 51. That is, the metal layers 51 and 52 are connected to the via wirings 32 through the seed layer 50.

The seed layer 50 is formed to continuously cover the inner surfaces of the through holes 40X (i.e. the inner side surfaces of the through holes 40X and the upper end surfaces 32A of the via wirings 32 exposed in the bottom portions of the through holes 40X) and the upper surface of the insulating layer 40. A metal film (sputtered film) formed by sputtering can be used as the seed layer 50. For example, a metal film having a two-layer structure in which a titanium (Ti) layer made of Ti, and a copper (Cu) layer made of Cu are formed in the named order on the inner surfaces of the through holes 40X and the upper surface of the insulating layer 40 can be used as the seed layer 50 formed by sputtering. In this case, a thickness of the Ti layer can be set, for example, in a range of about 10 to 50 nm, and a thickness of the Cu layer can be set, for example, in a range of about 100 to 500 nm. Incidentally, the Ti layer serves as a metallic barrier layer which suppresses copper from being diffused into the insulating layer 40 etc. from the Cu layer or the metal layer 51, 52 (e.g. a Cu layer). In addition, the Ti layer serves as an adhesive layer which improves adhesion properties between the insulating layer 40 and the seed layer 50. In addition to Ti, titanium nitride (TiN), tantalum nitride (TaN), tantalum (Ta), chromium (Cr), etc. can be used as the material of the metal film serving as such a metallic barrier layer and such an adhesive layer.

The metal layer 51 is formed to fill the through holes 40X on the inner side than the seed layer 50. The metal layer 52 is formed to cover an upper surface of the seed layer 50 formed on the insulating layer 40 and an upper surface of the metal layer 51. For example, a metal layer (electrolytic plating metal layer) formed by electrolytic plating can be used as each of the metal layers 51 and 52. Incidentally, copper or a copper alloy can be used as the material of the metal layer 51, 52. A thickness of the metal layer 52 can be set, for example, in a range of about 1 to 4 μm.

As shown in FIG. 1A, the insulating layer 42 is formed on the upper surface of the insulating layer 40 so as to cover the wiring layer 41. Through holes 42X are formed at required places in the insulating layer 42 to penetrate the insulating layer 42 in the thickness direction to expose portions of an upper surface of the wiring layer 41.

The wiring layer 43 is formed on an upper surface of the insulating layer 42. The wiring layer 43 is electrically connected to the wiring layer 41. The wiring layer 43 has via wirings which fill the through holes 42X, and wiring patterns which are formed on the upper surface of the insulating layer 42.

The insulating layer 44 is formed on the upper surface of the insulating layer 42 so as to cover the wiring layer 43. Through holes 44X are formed at required places in the insulating layer 44 to penetrate the insulating layer 44 in the thickness direction to expose portions of an upper surface of the wiring layer 43.

Here, each of the through holes 40X, 42X and 44X is formed into a tapered shape whose diameter is gradually smaller from the upper side (wiring layer 45 side) toward the lower side (wiring structure 21 side) in FIG. 1A. For example, the through hole 40X, 42X, 44X is formed substantially into an inverted truncated conical shape in which an opening diameter of an upper-side opening end is larger than an opening diameter of a lower-side opening end. The opening diameter of the upper-side opening end of the through hole 40X, 42X, 44X can be set, for example, in a range of about 5 to 10 μm.

The wiring layer 45 is formed on an upper surface 44A of the insulating layer 44. The wiring layer 45 is electrically connected to the wiring layer 43. The wiring layer 45 has via wirings which fill the through holes 44X, and connection terminals P2 which protrude upward from the upper surface 44A of the insulating layer 44. For example, each of the connection terminals P2 is a columnar connection terminal (metal post) which is formed to extend upward from the upper surface 44A of the insulating layer 44. The connection terminal P2 can be formed into any planar shape and with any size. For example, the planar shape of the connection terminal P2 can be formed as a circular shape having a diameter of about 20 to 25 μm. A pitch between adjacent ones of the connection terminals P2 can be set, for example, in a range of about 40 to 50 μm. The connection terminal P2 serves as an electronic component mounting pad for making electric connection with an electronic component such as a semiconductor chip.

Incidentally, if occasions demand, a surface treatment layer may be formed on front surfaces (upper surfaces and side surfaces or only upper surfaces) of the connection terminals P2. For example, the same layer as the surface treatment layer 25 formed on the external connection pads P1 can be used as the surface treatment layer.

Here, a volume ratio V1 of the wiring layer 31 and the via wirings 32 to the wiring structure 21 is set at a value not smaller than a volume ratio V2 of the wiring layers 41, 43, and 45 to the wiring structure 23. Specifically, a ratio V1/V2 of the volume ratio V1 to the volume ratio V2 is preferably in a range of 1.0 to 1.4, more preferably in a range of 1.0 to 1.14. When the ratio V1/V2 is set at such a value, warping of the wiring board 20 and the semiconductor device 10 can be reduced suitably. Details about this will be described in paragraphs about warping simulation.

Incidentally, the volume ratio V1 is a ratio of a volume of all the metal layers (i.e. the wiring layer 31 and the via wirings 32) included in the wiring structure 21, to an entire volume of the wiring structure 21. In addition, the volume ratio V2 is a ratio of a volume of all the metal layers (i.e. the wiring layers 41, 43 and 45) included in the wiring structure 23, to an entire volume of the wiring structure 23. The ratio V1/V2 between these volume ratios V1 and V2 can be set at a predetermined value when, for example, the region where the conductor patterns 31B are formed or the thickness of each of the wiring layer 31 and the wiring layers 41, 43 and 45 is adjusted appropriately.

Each semiconductor chip 60 is flip-chip mounted on the aforementioned wiring board 20. That is, connection terminals 61 disposed on a circuit formation surface (lower surface in this case) of the semiconductor chip 60 are bonded to the connection terminals P2 of the wiring board 20 through a bonding member 62. Thus, the semiconductor chip 60 is electrically connected to the wiring layer 45 through the connection terminals 61 and the bonding member 62.

For example, a logic chip such as a CPU (Central Processing Unit) chip or a GPU (Graphics Processing Unit) chip can be used as the semiconductor chip 60. Moreover, for example, a memory chip such as a DRAM (Dynamic Random Access Memory) chip, an SRAM (Static Random Access Memory) chip or a flash memory chip may be used as the semiconductor chip 60. Incidentally, when a plurality of semiconductor chips 60 are mounted on the wiring board 20, the logic chip and the memory chip may be used in combination to be mounted on the wiring board 20. Incidentally, the thickness of each semiconductor chip 60 can be set, for example, in a range of about 200 to 300 μm.

For example, a metal post can be used as each of the connection terminals 61. The connection terminal 61 is a columnar connection terminal extending downward from the circuit formation surface of the semiconductor chip 60. For example, the connection terminal 61 in this example is formed into a cylindrical shape. For example, copper or a copper alloy can be used as the material of the connection terminal 61. In addition to the metal post, for example, a gold bump may be used as the connection terminal 61.

The bonding member 62 is bonded to the connection terminals 61, and bonded to the wiring layer 45. For example, a tin (Sn) layer or solder plating of a lead (Pb)-free solder can be used as the bonding member 62. For example, an Sn-silver (Ag)-based, Sn—Cu-based, or Sn—Ag—Cu-based lead-free solder can be used as the material of the solder plating.

The sealing resin 70 is formed on the upper surface 44A of the uppermost insulating layer 44 of the wiring board 20 so as to seal each semiconductor chip 60. The sealing resin 70 is formed so as to cover the circuit formation surface (lower surface in this case) and a side surface of the semiconductor chip 60 and cover the upper surface 44A of the insulating layer 44, the wiring layer 45, the connection terminals 61, and the bonding member 62. The sealing resin 70 in this example is formed to expose a back surface (upper surface in this case) of the semiconductor chip 60 on an opposite side to the circuit formation surface thereof. For example, an upper surface of the sealing resin 70 is formed to be substantially flush with the back surface of the semiconductor chip 60.

For example, an insulating resin higher in mechanical strength (rigidity, hardness, etc.) than a photosensitive resin can be used as the material of the sealing resin 70. For example, a non-photosensitive insulating resin containing a thermosetting resin as a main component can be used as the material of the sealing resin 70. An insulating resin such as an epoxy resin or a polyimide resin, or any resin material in which a filler made of silica, alumina etc. is mixed into these resins can be used as the material of the sealing resin 70. For example, a molding resin can be used as the sealing resin 70. Moreover, a thickness of the sealing resin 70 can be set, for example, in a range of about 300 to 400 µm.

Next, effects of the wiring board 20 and the semiconductor device 10 will be described in accordance with FIG. 1B.

A portion of the wiring layer 31 is formed inside the recesses 30X of the insulating layer 30 to be embedded in the insulating layer 30. The side surface 31S of the upper portion of the wiring layer 31 is covered with the insulating layer 30, and the side surface 31S of the lower portion of the wiring layer 31 is covered with the solder resist layer 22. Therefore, the interface between the insulating layer 30 and the solder resist layer 22 is not formed in corner portions A1 of the wiring layer 31 where thermal stress is apt to be concentrated when the thermal stress occurs due to heating treatment in the wiring board 20. Thus, occurrence of cracking etc. in the interface between the insulating layer 30 and the solder resist layer 22 can be suppressed suitably when thermal stress occurs.

Further, the side surface 31S of the upper portion of the wiring layer 31 is covered with the insulating layer 30 covering the upper surface 31T of the wiring layer 31. Accordingly, an interface between the wiring layer 31 and the insulating layer 30 can be increased, in comparison with a case where the wiring layer 31 is formed on the lower surface 30B of the insulating layer 30. Thus, thermal stress caused by a difference in thermal expansion coefficient between the wiring layer 31 and the insulating layer 30 can be dispersed so that stress concentrated in one place (e.g. the corner portions A1 of the wiring layer 31) can be reduced. As a result, occurrence of cracking in the interface between the wiring layer 31 and the insulating layer 30 can be suppressed suitably.

Next, a method for manufacturing the semiconductor device 10 will be described. Although one semiconductor device 10 will be enlarged and described in the following description, a member including a plurality of semiconductor devices 10 is practically manufactured collectively on one substrate and then divided into the semiconductor devices 10 individually and separately.

As shown in FIG. 3A, a support substrate 100 is prepared. For example, a metal plate or a metal foil can be used as the support substrate 100. A copper foil in which an extremely thin copper foil is pasted on a support copper foil through a release layer is used as the support substrate 100 in this example. The extremely thin copper foil is about 2 to 5 µm thick. The support copper foil is about 35 to 70 µm thick.

Next, a metal film 101 is formed on an upper surface of the support substrate 100 to cover the entire upper surface of the support substrate 100. For example, the metal film 101 is formed on an upper surface of the extremely thin copper foil of the support substrate 100. The metal film 101 can be formed, for example, by sputtering, electrolytic plating or evaporation. An electrically conductive material which can serve as a stopper layer when the support substrate 100 is removed by etching can be used as the material of the metal film 101. In addition, an electrically conductive material which can be selectively removed by etching with respect to a wiring layer 31 which will be formed in a subsequent step can be used as the material of the metal film 101. For example, metal such as titanium (Ti), Ni, chromium (Cr) or Sn, or an alloy containing at least one selected from the aforementioned metals can be used as the material of such a metal film 101. Ni is used as the material of the metal film 101 in this example. A thickness of the metal film 101 can be set, for example, in a range of about 10 to 50 nm.

Successively, a seed layer 102 is formed on an upper surface of the metal film 101 to cover the entire upper surface of the metal film 101. The seed layer 102 can be formed, for example, by sputtering, electrolytic plating or electroless plating. For example, copper or a copper alloy can be used as the material of the seed layer 102. A thickness of the seed layer 102 can be set, for example, in a range of about 100 to 500 nm.

Next, in a step shown in FIG. 3B, a resist layer 103 having opening patterns 103X is formed on an upper surface of the seed layer 102. The opening patterns 103X are formed to expose the upper surface of the seed layer 102 in portions corresponding to regions where the wiring layer 31 should be formed (see FIG. 1A). As the material of the resist layer 103, for example, a material which is plating-resistant to plating treatment in a subsequent step can be used. For example, a photosensitive dry film resist or a liquid photoresist (e.g. a dry film resist or a liquid photoresist made of a novolac-based resin or an acrylic-based resin etc.) etc. can be used as the material of the resist layer 103. For example, assume that the photosensitive dry film resist is used. In this case, a dry film is laminated on the upper surface of the seed layer 102 by thermocompression bonding, and the dry film is then patterned by photolithographing. In this manner, the resist layer 103 having the opening patterns 103X is formed. Incidentally, in the case where the liquid photoresist is used alternatively, the resist layer 103 can be also formed via a similar step.

Successively, when electrolytic plating (electrolytic copper plating in this case) using the seed layer 102 as a plating power feeding layer is performed with the resist layer 103 as a plating mask, a metal layer 104 is formed on the upper surface of the seed layer 102 exposed from the opening patterns 103X of the resist layer 103.

Next, in a step shown in FIG. 3C, the resist layer 103 shown in FIG. 3B is removed by a release agent (e.g. an organic amine-based release agent, caustic soda, acetone, ethanol, etc.).

Successively, in a step shown in FIG. 3D, an unnecessary portion of the seed layer 102 is removed by etching (e.g. wet etching) with the metal layer 104 as an etching mask. For example, an acid aqueous solution such as a sulfuric acid/hydrogen peroxide mixture solution (a mixed aqueous solution of sulfuric acid and hydrogen peroxide water) can be used as an etchant of the wet etching. By this step, the wiring layer 31 constituted by the seed layer 102 and the metal layer 104 is formed on the upper surface of the metal film 101. On this occasion, wiring patterns 31A and conductor patterns 31B disposed in a region where the wiring patterns 31A are not disposed are formed on the upper surface of the metal film 101.

Next, the metal film 101 is removed by etching with the wiring layer 31 as an etching mask. For example, assume that Ti is used as the material of the metal film 101. In this case, the metal film 101 is selectively etched and removed with respect to the wiring layer 31 and the support substrate 100 (Cu layer) by dry etching using etching gas of carbon tetrafluoride ($CF_4$) etc. or by wet etching using a potassium hydroxide (KOH)-based etchant. On this occasion, the support substrate 100 serves as a stopper layer when the metal film 101 is etched.

Incidentally, in FIGS. 4A to 9B following FIG. 3D, the seed layer 102 and the metal layer 104 are not shown but illustrated as the wiring layer 31.

Figure 4A:
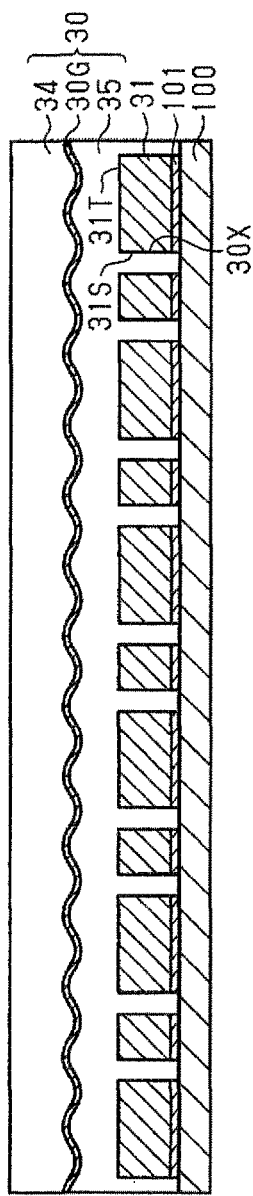
FIGS. 4A to 4C are schematic sectional views showing the method for manufacturing the semiconductor device according to the embodiment.

Next, in a step shown in FIG. 4A, an insulating layer 30 is formed on the upper surface of the support substrate 100 to cover an entire upper surface 31T and an entire side surface 31S of the wiring layer 31 and an entire side surface of the metal film 101. For example, the insulating layer 30 can be formed as a resin film which is laminated on the support substrate 100, and then hardened by heat treatment at a temperature of about 130 to 200° C. while being pressed. Here, a resin film in which a glass cloth 30G serving as a reinforcing material is impregnated with a thermosetting resin such as an epoxy resin can be used as the resin film. In the insulating layer 30 formed by this step, an upper surface of the glass cloth 30G is covered with a resin layer 34 and a lower surface of the glass cloth 30G is covered with a resin layer 35 having the same thickness as the resin layer 34, as shown in FIG. 4A. Therefore, in the insulating layer 30 in this case, the glass cloth 30G is provided and disposed in the vicinity of a thicknesswise center of the insulating layer 30. Incidentally, by this step, a thickness between a center of the glass cloth 30G and an upper surface of the resin layer 34 can be formed, for example, to be about 20 to 25 μm and a thickness between the center of the glass cloth 30G and a lower surface of the resin layer 35 can be formed, for example, to be about 20 to 25 μm.

In addition, by this step, recesses 30X which receive the wiring layer 31 and the metal film 101 are formed in the insulating layer 30, and the wiring layer 31 and the metal film 101 are formed in the bottoms of the recesses 30X.

Figure 4B:
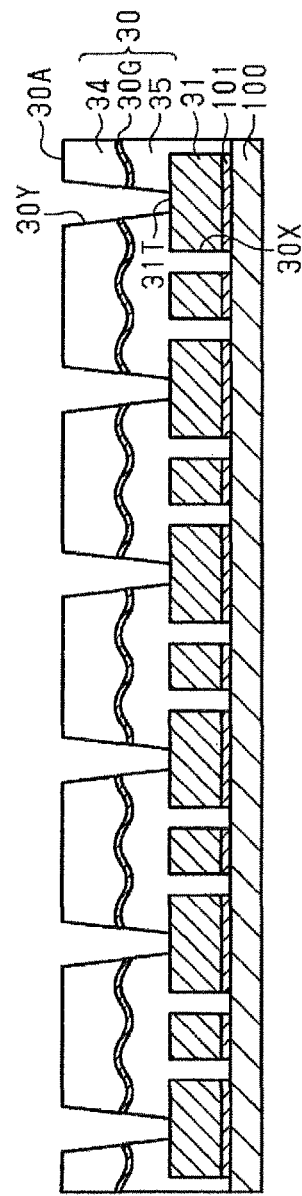

Successively, in a step shown in FIG. 4B, through holes 30Y are formed at required places in the insulating layer 30 to expose portions of the upper surface 31T of the wiring layer 31. The through holes 30Y can be formed, for example, by laser machining using a $CO_2$ laser, a UV-YAG laser, etc.

Next, in the case where the through holes 30Y have been formed by laser machining, desmear treatment is performed to remove resin smears adhering to the exposed surface of the wiring layer 31 exposed in bottom portions of the through holes 30Y. By the desmear treatment, inner side surfaces of the through holes 30Y and the upper surface 30A of the insulating layer 30 are roughened.

Figure 4C:
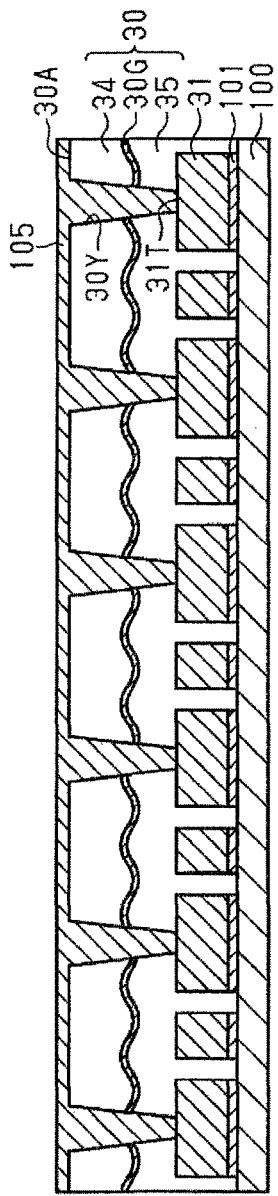

Next, in a step shown in FIG. 4C, a seed layer (not shown) is formed to cover the entire front surface of the insulating layer 30 including the inner side surfaces of the through holes 30Y and the entire upper surface 31T of the wiring layer 31 exposed in the through holes 30Y, and electrolytic plating using the seed layer as a power feeding layer is performed. For example, the seed layer is formed by electroless copper plating and electrolytic copper plating using the seed layer as a power feeding layer is performed. Thus, an electrically conductive layer 105 is formed to fill the through holes 30Y therewith and cover the entire upper surface 30A of the insulating layer 30 therewith.

Figure 5A:
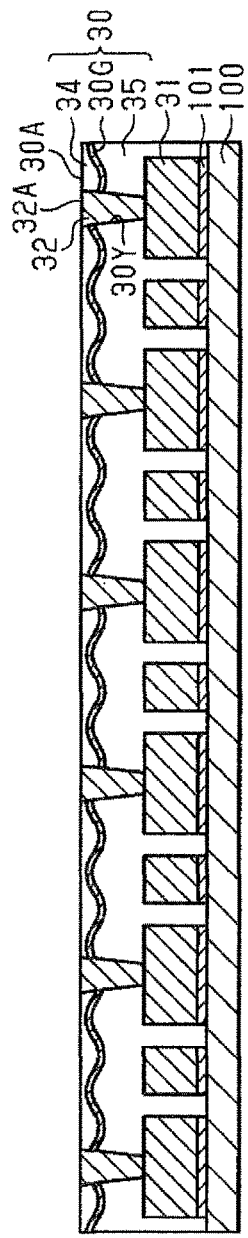
FIGS. 5A to 5C are schematic sectional views showing the method for manufacturing the semiconductor device according to the embodiment.

Successively, for example, by a CMP (Chemical Mechanical Polishing) method etc., the electrically conductive layer 105 protruding from the upper surface 30A of the insulating layer 30 is polished, and a portion of the upper surface 30A of the insulating layer 30 which is a roughened surface is polished. Thus, via wirings 32 filling the through holes 30Y are formed, and upper end surfaces 32A of the via wirings 32 and the upper surface 30A of the insulating layer 30 are formed to be substantially flush with each other, as shown in FIG. 5A. In addition, when the portion of the upper surface 30A of the insulating layer 30 is polished, the upper surface 30A of the insulating layer 30 is smoothened. For example, roughness of the upper surface 30A of the insulating layer 30 prior to the polishing is about 300 to 400 nm in terms of surface roughness Ra value, whereas the roughness of the upper surface 30A of the insulating layer 30 can be changed to about 15 to 40 nm in terms of surface roughness Ra value due to the polishing. In other words, by this step, the upper surface 30A of the insulating layer 30 is polished so that the upper surface 30A of the insulating layer 30 can be smoothened (e.g. to have a surface roughness Ra value of about 15 to 40 nm). Incidentally, since the inner side surfaces of the through holes 30Y are roughened as they are, surface roughness of the upper surface 30A of the insulating layer 30 is smaller than that of the inner side surface of each through hole 30Y. Due to the polishing in this step, the upper surface 30A of the insulating layer 30 and the upper end surfaces 32A of the via wirings 32 become polished surfaces, and substantially flush each other.

Further, when the portion of the upper surface 30A of the insulating layer 30 is polished as described above, of the insulating layer 30, the resin layer 34 which covers the upper surface of the glass cloth 30G is thinned. Therefore, the resin layer 34 is thinner in thickness than the resin layer 35 which covers the lower surface of the glass cloth 30G. Thus, the glass cloth 30G which was provided in the vicinity of the thicknesswise center of the insulating layer 30 prior to the polishing is positioned on an upper side (the upper surface 30A side of the insulating layer 30) with respect to the thicknesswise center of the insulating layer 30. Incidentally, in this example, the insulating layer 30 is polished to such an extent that the glass cloth 30G of the insulating layer 30 is not exposed from the resin layer 34.

Here, a removal amount of the insulating layer 30 in this example can be set, for example, in a range of about 5 to 10 μm. Therefore, the thickness of the polished resin layer 34 may be, for example, about 10 to 15 μm.

Incidentally, when, for example, the electrically conductive layer 105 (see FIG. 4C) formed on the upper surface 30A of the insulating layer 30 is polished by the CMP method in this example, the material of slurry, hardness of a polishing pad, etc. are adjusted to make a polishing amount of the electrically conductive layer 105 (metal) larger than a polishing amount of the resin layer 30 (resin). Moreover, in the CMP method in this example, the material of the slurry, the hardness of the polishing pad, etc. are changed, for example, after the upper surface 30A of the insulating layer 30 is exposed. Specifically, after the upper surface 30A of the insulating layer 30 is exposed, the material of the slurry, the hardness of the polishing pad, etc. are adjusted to make the polishing amount of the insulating amount 30 (resin) larger than the polishing amount of the electrically conductive layer 105 (metal).

Figure 5B:
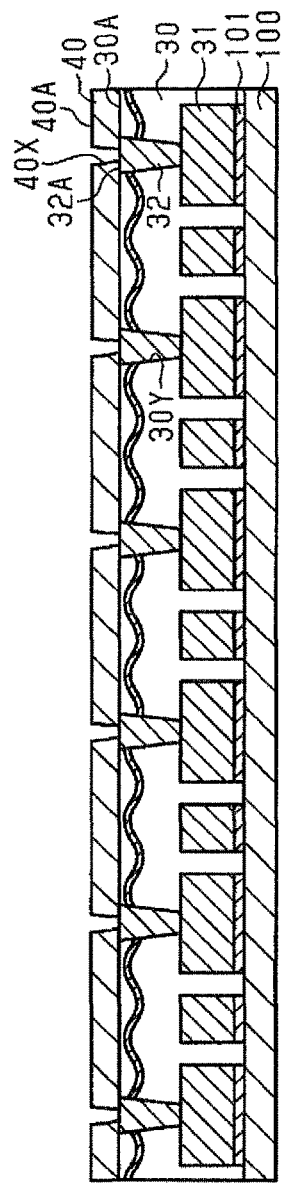

Next, in a step shown in FIG. 5B, an insulating layer 40 which has through holes 40X to expose portions of the upper end surfaces 32A of the via wirings 32 is formed on the upper surface 30A of the insulating layer 30. For example, assume that a resin film is used as the insulating layer 40. In this case, the insulating layer 40 can be formed by laminating the resin film on the upper surface 30A of the insulating layer 30 by thermocompression bonding and then patterning the resin film by photolithographing. Alternatively, the insulating layer 40 may be formed by applying a liquid or paste-like insulating resin on the upper surface 30A of the insulating layer 30 by spin coating etc., and then patterning the insulating resin by photolithographing.

Incidentally, roughness of an upper surface 40A of such an insulating layer 40 made of an insulating resin containing a photosensitive resin as a main component can be set, for example, to be about 2 to 10 nm in terms of surface roughness Ra value. That is, the upper surface of the insulating layer 40 has lower surface roughness than the inner side surface of each through hole 30Y and smaller surface roughness than the upper surface 30A (polished surface) of the insulating layer 30.

Figure 5C:
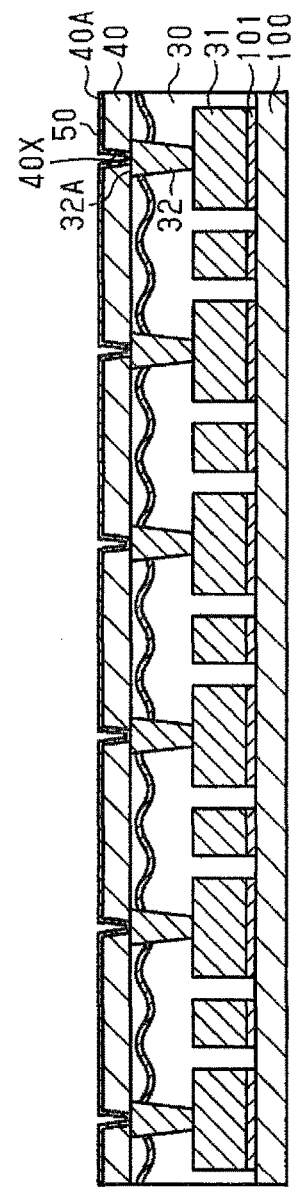

Next, in a step shown in FIG. 5C, a seed layer 50 is formed so as to cover entire inner surfaces of the through holes 40X, (entire inner side surfaces of the through holes 40X and the entire upper end surfaces 32A of the via wirings 32 exposed in the through holes 40X) and the upper surface 40A of the insulating layer 40. The seed layer 50 can be formed, for example, by sputtering or electroless plating.

For example, assume that the seed layer 50 is formed by sputtering. In this case, titanium (Ti) is first deposited on the upper surface 40A of the insulating layer 40 and the inner surfaces of the through holes 40X by sputtering, so that a Ti layer can be formed to cover the upper surface 40A and the inner surfaces of the through holes 40X. Then, copper is deposited on the Ti layer by sputtering so that a Cu layer can be formed. Thus, the seed layer 50 having a two-layer structure (the Ti layer/the Cu layer) can be formed. When the seed layer 50 is formed by electroless plating alternatively, for example, the seed layer 50 consisting of a Cu layer (one-layer structure) can be formed by electroless copper plating.

Figure 6A:
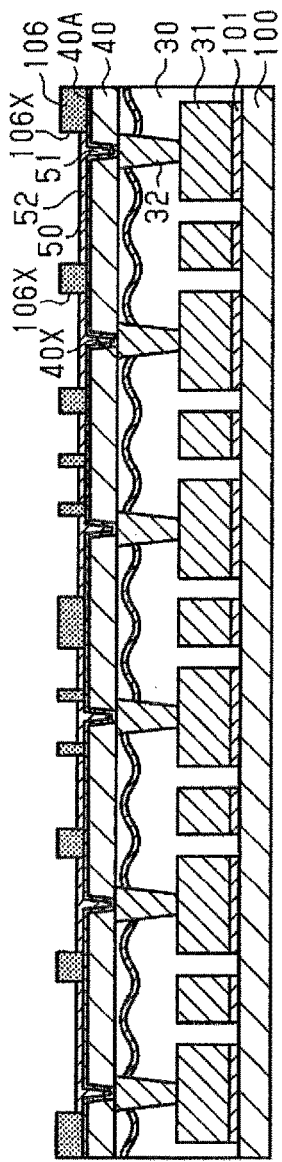
FIGS. 6A to 6C are schematic sectional views showing the method for manufacturing the semiconductor device according to the embodiment.

Next, in a step shown in FIG. 6A, a resist layer 106 having opening patterns 106X at required places is formed on the seed layer 50. The opening patterns 106X are formed to expose the seed layer 50 in portions corresponding to regions where a wiring layer 41 (see FIG. 1A) should be formed. For example, a material plating-resistant to plating treatment in a subsequent step can be used as the material of the resist layer 106. As the material of the resist layer 106, for example, the same material as that of the resist layer 103 (see FIG. 3B) can be used. In addition, the resist layer 106 can be formed by the same method as the resist layer 103.

Next, electrolytic plating (electrolytic copper plating in this case) using the seed layer 50 as a plating power feeding layer is performed on the seed layer 50 exposed from the opening patterns 106X of the resist layer 106, with the resist layer 106 as a plating mask. Thus, a metal layer 51 is formed to fill the through holes 40X on an inner side than the seed layer 50, and a metal layer 52 is formed on the upper surface 40A of the insulating layer 40.

Figure 6B:
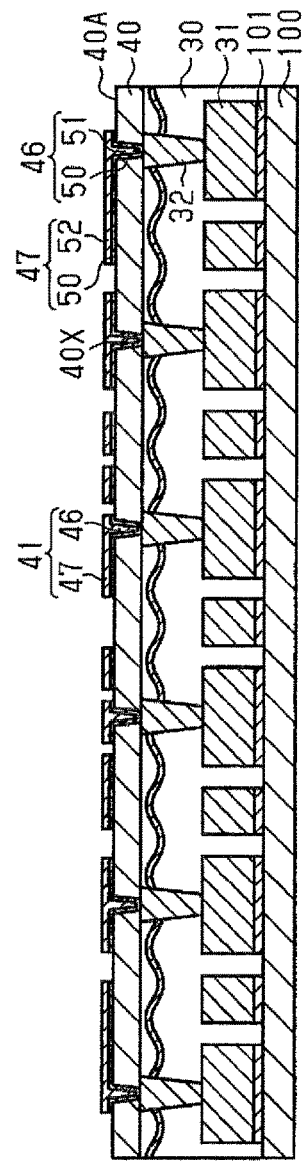

Successively, the resist layer 106 is removed, for example, by an alkaline release agent. Next, an unnecessary portion of the seed layer 50 is removed by etching with the metal layers 51 and 52 as an etching mask. For example, in the case where the seed layer 50 consists of the Ti layer and the Cu layer, the Cu layer is first removed by wet etching using a sulfuric acid/hydrogen peroxide mixture-based etchant. Then, the Ti layer is removed, for example, by dry etching using etching gas of $CF_4$ etc. or by wet etching using a KOH-based etchant. By this step, via wirings 46 consisting of the seed layer 50 and the metal layer 51 which are formed in the through holes 40X are formed in the through holes 40X, as shown in FIG. 6B. In addition, wiring patterns 47 consisting of the seed layer 50 and the metal layer 52 which are formed on the upper surface 40A of the insulating layer 40 are formed on the upper surface 40A of the insulating layer 40. Thus, a wiring layer 41 consisting of the via wirings 46 and the wiring patterns 47 is formed. Thus, the wiring layer 41 is formed by a semi-additive method. Incidentally, in FIGS. 6C to 9B following FIG. 6B, the seed layer 50 and the metal layers 51 and 52 are not shown but illustrated as the wiring layer 41.

Figure 6C:
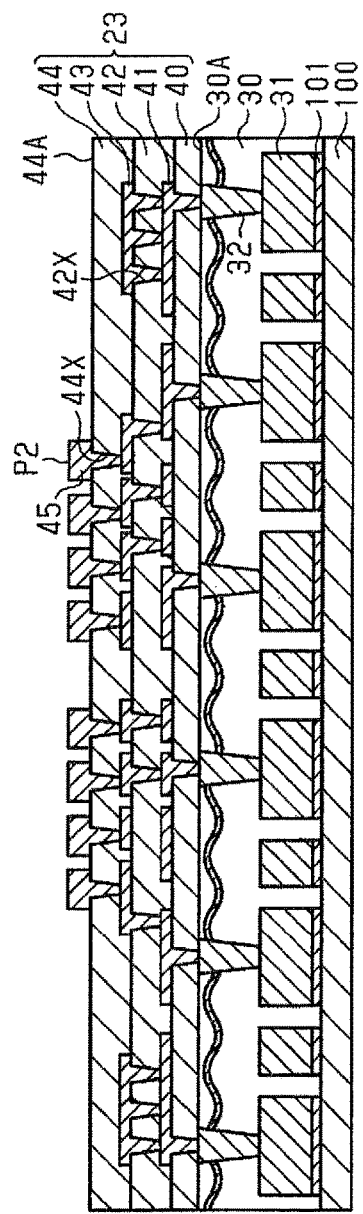

Next, in a step shown in FIG. 6C, an insulating layer 42 having through holes 42X to expose portions of an upper surface of the wiring layer 41 is formed on the insulating layer 40 in the same manner as in the step shown in FIG. 5B. Successively, a wiring layer 43 is formed, for example, by a semi-additive method in the same manner as in the steps shown in FIGS. 5C to 6B. The wiring layer 43 has via wirings which fill the through holes 42X, and wiring patterns which are formed on the insulating layer 42 to be electrically connected to the wiring layer 41 through the via wirings.

Next, an insulating layer 44 having through holes 44X to expose portions of an upper surface of the wiring layer 43 is formed on the insulating layer 42 in the same manner as in the step shown in FIG. 5B. Successively, a wiring layer 45 is formed, for example, by a semi-additive method in the same manner as in the steps shown in FIGS. 5C to 6B. The wiring layer 45 has via wirings which fill the through holes 44X, and connection terminals P2 which are formed on an upper surface 44A of the insulating layer 44 to be electrically connected to the wiring layer 43 through the via wirings. Incidentally, if occasions demand, a surface treatment layer may be formed on front surfaces (upper surfaces and side surfaces or only upper surfaces) of the connection terminals P2.

Next, in a step shown in FIG. 7A, semiconductor chips 60 are first prepared. Each of the semiconductor chips 60 has connection terminals 61 formed on its circuit formation surface, and a bonding member 62 formed on lower surfaces of the connection terminals 61. Successively, the connection terminals 61 of the semiconductor chips 60 are flip-chip bonded on the connection terminals P2. For example, assume that each of the bonding members 62 is a solder layer. In this case, the connection terminals P2 and the connection terminals 61 are aligned with each other respectively, and then, reflow treatment is performed to melt the bonding member 62 (solder layer) so that the connection terminals 61 can be electrically connected to the connection terminals P2 through the bonding member 62.

Next, in a step shown in FIG. 7B, a sealing resin 70 for sealing the semiconductor chips 60 is formed on the upper surface 44A of the insulating layer 44. For example, the sealing resin 70 is formed to cover side surfaces and the circuit formation surfaces of the semiconductor chips 60 and cover front surfaces of the connection terminals P2 and 61 and the bonding members 62. In this example, the sealing resin 70 is formed to expose back surfaces of the semiconductor chips 60. The present disclosure is not limited thereto.

The sealing resin 70 may be formed to cover the back surfaces of the semiconductor chips 60.

For example, assume that a thermosetting molding resin is used as the material of the sealing resin 70. In this case, a structure body shown in FIG. 7A is received in a mold, and the molding resin in a fluidized form is introduced into the mold with pressure (e.g. 5 to 10 MPa) applied thereto. Then, the molding resin is heated and hardened at a temperature of about 180° C. Thus, the sealing resin 70 is formed. Incidentally, for example, a method such as a transfer molding method, a compression molding method or an injection molding method can be used as the method for filling with the molding resin.

Successively, in a step shown in FIG. 8A, the semiconductor chips 60 and the sealing resin 70 are thinned from the upper surface side. For example, an upper surface of the sealing resin 70 and the back surfaces (upper surfaces in this case) of the semiconductor chips 60 are ground by back grinding etc., so that the semiconductor chips 60 and the sealing resin 70 are thinned. A thickness of each semiconductor chip 60 prior to the thinning is, for example, about 700 to 1,000 µm, whereas the thickness of the semiconductor chip 60 can be changed, for example, to about 200 to 300 µm due to the thinning. By this step, the upper surface of the sealing resin 70 and the back surfaces of the semiconductor chips 60 are formed to be substantially flush with each other.

Next, the support substrate 100 is removed. For example, the support copper foil of the support substrate 100 is mechanically released from the extremely thin copper foil. On this occasion, the release layer is interposed between the support copper foil and the extremely thin copper foil, so that adhesive force between the support copper foil and the extremely thin copper foil is weak. Accordingly, the support copper foil can be released easily from the extremely thin copper foil. Then, the extremely thin copper foil remaining on the metal film 101 and the insulating layer 30 is removed, for example, by wet etching using a ferric chloride aqueous solution, a cupric chloride aqueous solution, an ammonium persulfate aqueous solution, etc. On this occasion, the metal film 101 and the insulating layer 30 serve as a stopper layer when the extremely thin copper foil of the support substrate 100 is etched. By this step, a lower surface of the metal film 101 and a lower surface 30B of the insulating layer 30 are exposed to the outside, as shown in FIG. 8B.

Figure 9A:
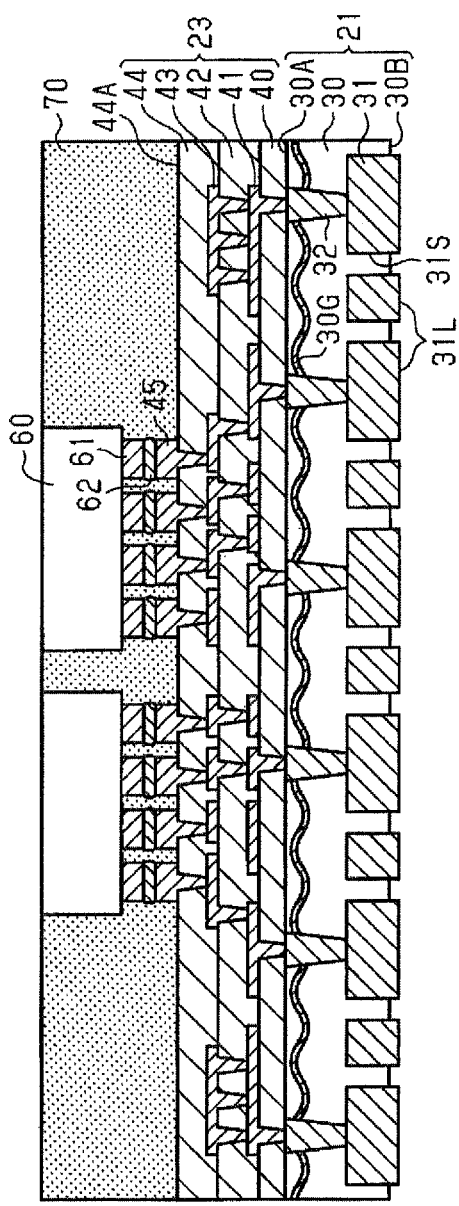
FIGS. 9A and 9B are schematic sectional views showing the method for manufacturing the semiconductor device according to the embodiment.

Next, in a step shown in FIG. 9A, the insulating layer 30 is thinned from the lower surface 30B side. For example, the insulating layer 30 is thinned from the lower surface side 30B by dry etching (plasma etching) using etching gas of $CF_4$ etc. Specifically, the insulating layer 30 is thinned from the lower surface 30B side so that the side surface 31S of a lower portion of the wiring layer 31 (the side surface 31S of a lower side of the wiring layer 31) can be exposed from the insulating layer 30. In addition, in the step, the metal film 101 (Ti film) shown in FIG. 8B is also etched and removed by the aforementioned dry etching. On this occasion, the wiring layer 31 serves as a stopper layer when the metal film 101 is etched. Incidentally, a lower surface 31L of the wiring layer 31 is exposed to the outside due to the removal of the metal film 101.

Figure 9B:
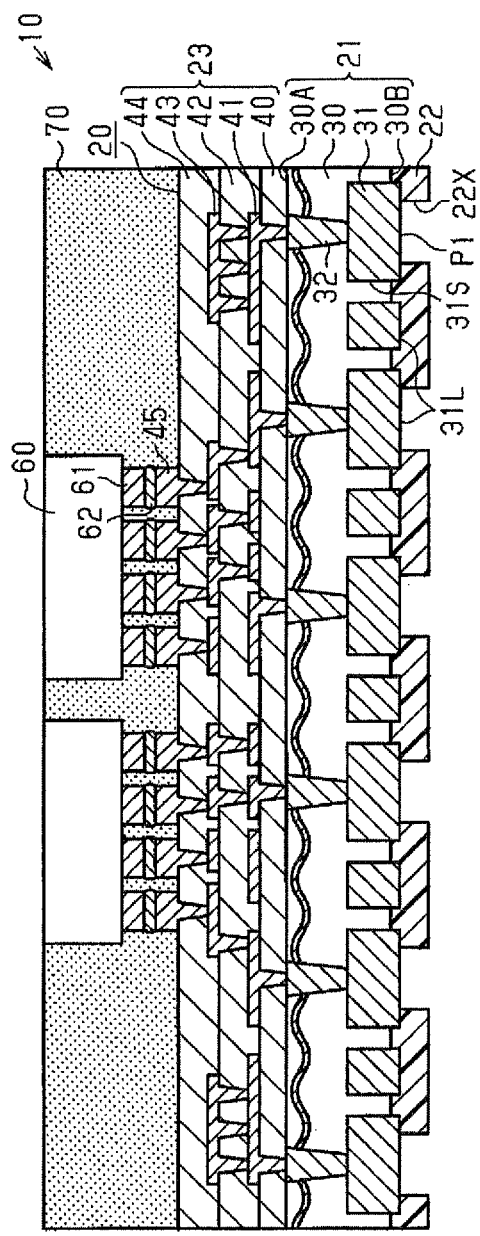

Next, in a step shown in FIG. 9B, a solder resist layer 22 having opening portions 22X is formed on the lower surface 30B of the insulating layer 30 so as to cover the side surface 31S of the wiring layer 31 exposed from the insulating layer 30 and to expose portions of the lower surface 31L of the wiring layer 31. For example, the solder resist layer 22 can be formed by laminating a photosensitive solder resist film or applying a liquid solder resist and patterning the resist into a predetermined shape. Thus, the portions of the lower surface 31L of the wiring layer 31 are exposed as external connection pads P1 from the opening portions 22X of the solder resist layer 22. Then, a surface treatment layer 25 (see FIG. 1A) is formed on the external connection pads P1 if occasions demand.

By the aforementioned manufacturing steps, it is possible to manufacture a wiring structure 21 on a lower surface of a wiring structure 23, and it is possible to manufacture a semiconductor device 10 shown in FIG. 1.

(Warping Simulation)

Figure 13:
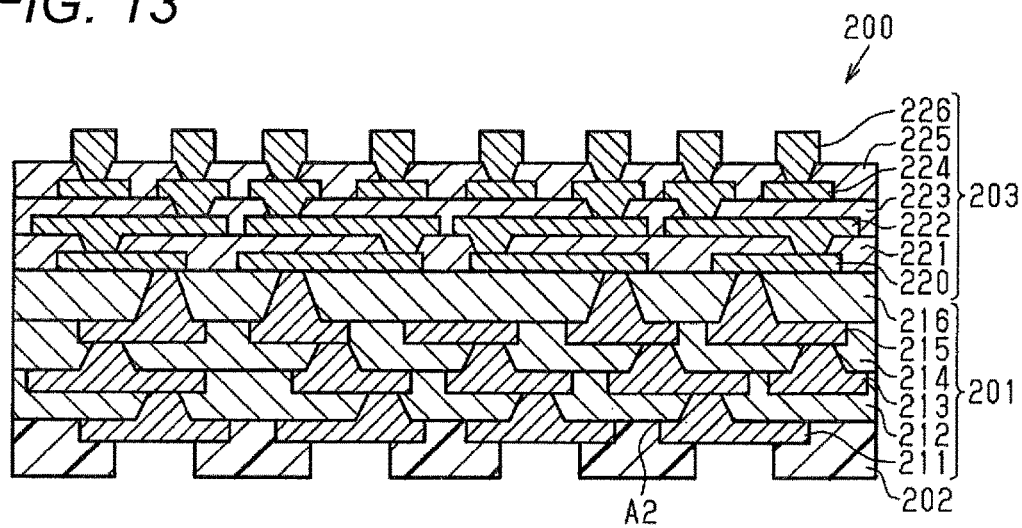
FIG. 13 is a schematic sectional view showing a related-art wiring board.

Warping simulation was executed on the wiring board 20 (Example) shown in FIG. 1A and the related-art wiring board 200 shown in FIG. 13.

(Simulation Conditions)

In the wiring board 20 according to the Example, a thickness between the lower surface and the upper surface of the solder resist layer 22 was set to 22 µm, a thickness of the wiring layer 31 was set to 15 µm, and a thickness between the lower surface 30B and the upper surface 30A of the insulating layer 30 was set to 30 µm. In addition, in the wiring board 20, a thickness between the lower surface and the upper surface of the insulating layer 40 was set to 5 µm, a thickness between the lower surface and the upper surface of each insulating layer 42, 44 was set to 7 µm, a thickness of each wiring layer 41, 43 was set to 2 µm, and a thickness of the wiring layer 45 was set to 10 µm. That is, an entire thickness of the wiring board 20 (i.e. a thickness between the lower surface of the solder resist layer 22 and the upper surface of the wiring layer 45) was set to 81 µm. In addition, a volume ratio V2 of the wiring layers 41, 43 and 45 to the wiring structure 23 was set to 70%. Warping simulation was executed in a case where a volume ratio V1 of the wiring layer 31 and the via wirings 32 to the wiring structure 21 in such a wiring board 20 was changed to 0%, 10%, 20%, 30%, 40%, 50%, 60%, 70%, 80%, 90% or 100%.

On the other hand, in the wiring board 200 according to Comparative Example, a thickness of the lower surface and the upper surface of the solder resist layer 202 was set to 35 µm, a thickness of each wiring layer 211, 213, 215 was set to 15 µm, and a thickness of the lower surface and the upper surface of each insulating layer 212, 214, 216 was set to 30 µm. In addition, in the wiring board 200, a thickness of each wiring layer 220, 222, 224 was set to 2 µm, a thickness of the lower surface and the upper surface of each insulating layer 221, 223, 225 was set to 7 µm, and a thickness of the wiring layer 226 was set to 10 µm. That is, an entire thickness of the wiring board 200 (i.e. a thickness between the lower surface of the solder resist layer 202 and the upper surface of the wiring layer 226) was set to 156 µm. Thus, the entire thickness of the wiring board 200 according to the Comparative Example was set to be thicker by 75 µm than the entire thickness of the wiring board 20 according to the Example. Warping simulation was executed under the same conditions as in the case of the Example.

(Simulation Result)

Figure 10:
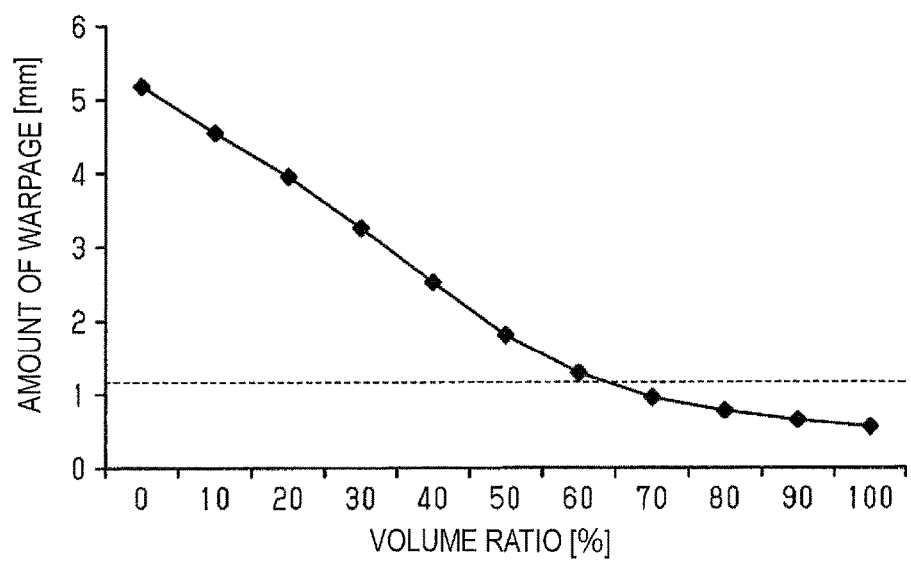
FIG. 10 is a graph showing a simulation result.

A warping simulation result is shown in FIG. 10. In FIG. 10, a warp amount (specifically 1.13 mm) designated by a broken line is a warp amount in the wiring board 200 according to the Comparative Example. As shown in FIG. 10, it has been confirmed that a warp amount in the wiring board 20 according to the Example is smaller as the volume ratio V1 is higher. Specifically, it has been confirmed that when the volume ratio V1 is set in a range of 70 to 100%, the warp amount of the wiring board 20 can be made smaller than that according to the Comparative Example. That is, it has been confirmed that when a ratio V1/V2 of the volume ratio V1 to the volume ratio V2 (70% in this case) is set in a range of about 1.0 to 1.4, the warp amount of the wiring board 20 can be made smaller than that according to the Comparative Example. It has been further confirmed that when the ratio V1/V2 between the volume ratios V1 and V2 is set in a range of about 1.0 to 1.4, the warp amount of the wiring board 20 can be made smaller than that of the wiring board 200 according to the Comparative Example which was set to be thicker than the wiring board 20.

When arrangement of the via wirings 32 and the wiring layer 31 is taken into consideration here, there is a limit in increasing the volume ratio V1. Accordingly, it is preferable that the volume ratio V1 is set to be not more than 80%.

From the aforementioned description, in order to effectively suppress the warp amount of the wiring board 20, the ratio V1/V2 of the volume ratio V1 to the volume ratio V2 is set preferably in a range of 1.0 to 1.4, more preferable in a range of 1.0 to 1.14.

According to the aforementioned embodiment, the following effects can be obtained.

(1) The portions of the wiring layer 31 are formed in the recesses 30X of the insulating layer 30 so as to be embedded in the insulating layer 30. In addition, the side surface 31S of the upper portion of the wiring layer 31 is covered with the insulating layer 30, and the side surface 31S of the lower portion of the wiring layer 31 is covered with the solder resist layer 22. Thus, when thermal stress occurs due to differences in thermal expansion coefficient among the wiring layer 31, the insulating layer 30 and the solder resist layer 22, occurrence of cracking in the respective interfaces among the wiring layer 31, the insulating layer 30 and the solder resist layer 22 can be suppressed suitably.

(2) In addition, due to the configuration in which the portions of the wiring layer 31 are embedded in the insulating layer 30, the entire thickness of the wiring board 20 and the entire thickness of the semiconductor device 10 can be reduced, in comparison with those in the case where the wiring layer 31 is formed on the lower surface 30B of the insulating layer 30.

Further, due to the configuration in which the portions of the wiring layer 31 are embedded in the insulating layer 30 in which the insulating resin is set to be thick in thickness, the wiring layer 31 can be formed to be thick easily. Thus, rigidity in the wiring structure 21 can be enhanced so that occurrence of warping in the wiring board 20 can be suppressed suitably.

(3) The wiring board 20 has a structure in which the solder resist layer 22 is formed on one side of the wiring structure 21 and the wiring structure 23 serving as a high-density wiring layer is formed on the other side of the wiring structure 21. That is, the wiring board 20 has a vertically asymmetric structure with respect to the wiring structure 21. In the wiring board 20, the glass cloth 30G high in rigidity is however disposed on the wiring structure 23 side with respect to the thicknesswise center C1 of the insulating layer 30 inside the wiring structure 21. Thus, the position of the glass cloth 30G high in rigidity can be made close to the thicknesswise center of the wiring board 20. Therefore, when the wiring board 20 is seen in the up/down direction (thickness direction), the wiring board 20 can be approximated as a vertically symmetric structure with respect to the glass cloth 30G. As a result, the wiring board 20 can be formed to have a structure strong against warping so that occurrence of warping in the wiring board 20 can be suppressed suitably.

(4) Further, the glass cloth 30G is provided to be positioned in the center of the thickness T3 between the lower surface 31L of the wiring layer 31 and the upper surface 44A of the insulating layer 44. That is, in the wiring board 20, the thicknesses of the respective members are set so that the thickness between the lower surface of the glass cloth 30G and the lower surface 31L of the wiring layer 31 and the thickness between the upper surface of the glass cloth 30G and the upper surface 44A of the insulating layer 44 can be equal to each other. Thus, the glass cloth 30G high in rigidity can be positioned closer to the thicknesswise center of the wiring board 20. As a result, the wiring board 20 can be formed to have a structure strong against warping so that occurrence of warping in the wiring board 20 can be suppressed suitably.

(5) The ratio V1/V2 of the volume ratio V1 of the wiring layer 31 and the via wirings 32 to the wiring structure 21 relative to the volume ratio V2 of the wiring layers 41, 43 and 45 to the wiring structure 23 is set in a range of 1.0 to 1.4. Thus, occurrence of warping in the wiring board 20 can be suppressed suitably.

(6) The insulating layer of the wiring structure 21 is constituted by only one insulating layer 30. Thus, the entire thickness of the wiring board 20 and the entire thickness of the semiconductor device 10 can be reduced, in comparison with that of the related-art wiring board 200.

Other Embodiments

Incidentally, the aforementioned embodiment may be carried out in the following modes in which the wiring board 20 is changed appropriately.

Although the aforementioned embodiment has a configuration in which the lower end surfaces of the via wirings 46 are directly connected to the upper end surfaces 32A of the via wirings 32, the structure of the wiring structure 23 is not limited thereto.

Figure 11:
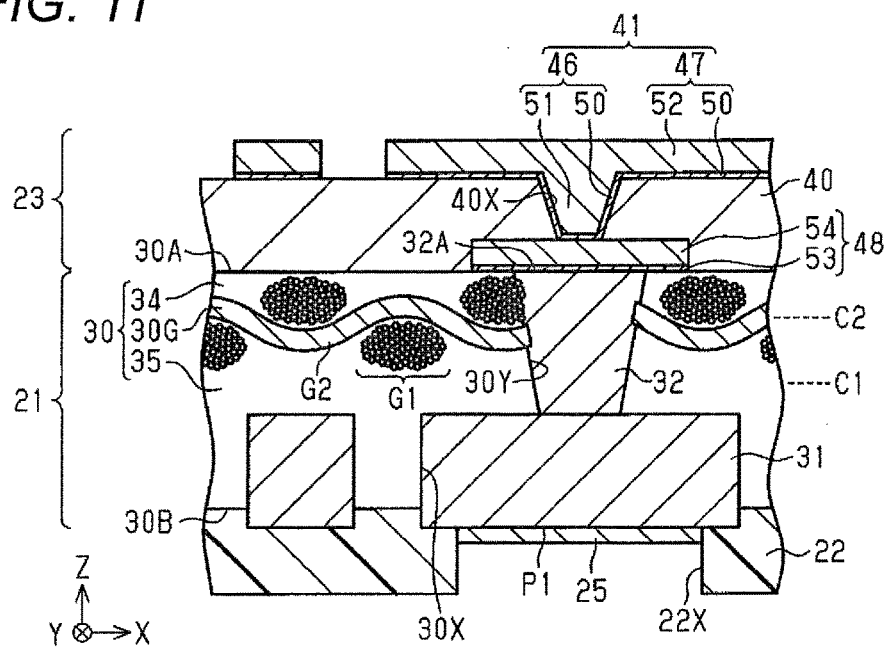
FIG. 11 is an enlarged sectional view in which a portion of a semiconductor device according to a modification is enlarged.

For example, as shown in FIG. 11, a wiring layer 48 may be formed on the upper surface 30A of the insulating layer 30 so as to be connected to the upper end surfaces 32A of the via wirings 32. That is, portions of a lower surface of the wiring layer 48 in this example contact the upper end surfaces 32A of the via wirings 32, so that the wiring layer 48 and the via wirings 32 are electrically connected to each other. In other words, the wiring layer 48 and the via wirings 32 are electrically connected to each other, but they are formed not integrally but separately.

For example, the wiring layer 48 has a seed layer 53 which is formed on the upper surface 30A of the insulating layer 30 and the upper end surfaces 32A of the via wirings 32, and a metal layer 54 which is formed on the seed layer 53. That is, the metal layer 54 is connected to the via wirings 32 through the seed layer 53. The same material as that of the seed layer 50 can be used as the material of the seed layer 53. The same material as that of the metal layer 51, 52 can be used as the material of the metal layer 54. Incidentally, the via wirings 46 in this case are connected to an upper surface of the wiring layer 48.

Although the glass cloth 30G is disposed inside the insulating layer 30 so as not to be exposed from the upper surface 30A of the insulating layer 30 in the aforementioned embodiment, the present disclosure is not limited thereto.

Figure 12:
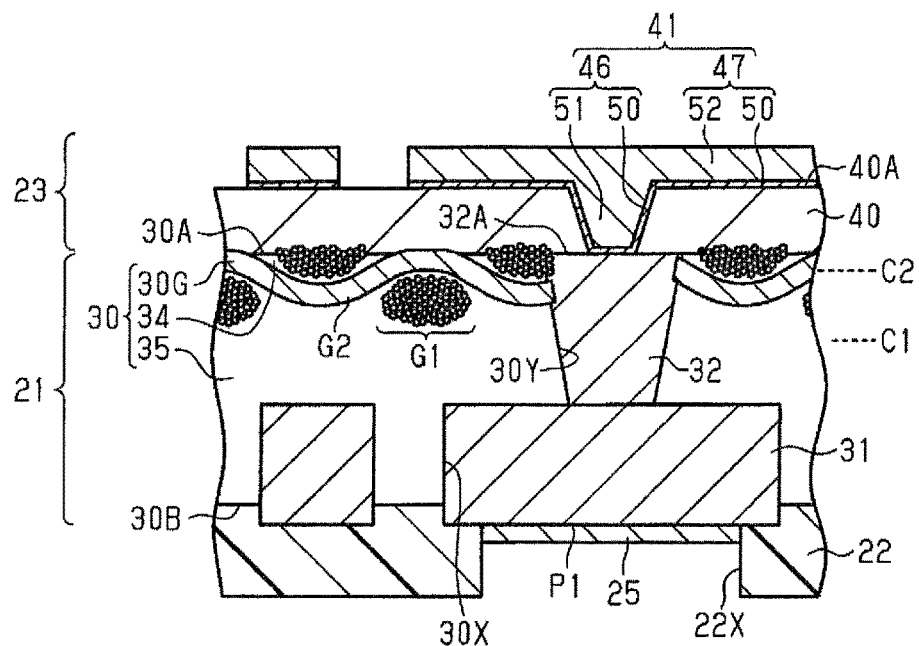
FIG. 12 is an enlarged sectional view in which a portion of a semiconductor device according to a modification is enlarged.

For example, as shown in FIG. 12, portions of the glass cloth 30G may be exposed from the upper surface 30A of the insulating layer 30. In this case, roughness of the upper surface 30A of the insulating layer 30 is however increased due to the exposed portions of the glass cloth 30G. Therefore, it is preferable that formation of the wiring layer 48 (see FIG. 11) is omitted so that the lower end surfaces of the via wirings 46 can be directly connected to the upper end surfaces 32A of the via wirings 32.

Although the aforementioned embodiment has a configuration in which the thicknesses of the resin layers 34 and 35 are set so that the glass cloth 30G can be disposed in the vicinity of the center of the thickness T3 of the wiring board 20, the present disclosure is not limited thereto. For example, the thickness of the resin layer 34 may be merely set to be thinner than that of the resin layer 35. Even in such a structure, the same effects as the effects (1) to (3), (5) and (6) of the aforementioned embodiment can be obtained.

In the aforementioned embodiment, the upper end surfaces 32A of the via wirings 32 are formed to be flush with the upper surface 30A of the insulating layer 30. The present disclosure is not limited thereto. For example, the upper end surfaces 32A of the via wirings 32 may be formed to be recessed more downward than the upper surface 30A of the insulating layer 30. Alternatively, the upper end surfaces 32A of the via wirings 32 may be formed to protrude upward from the upper surface 30A of the insulating layer 30.

The aforementioned embodiment has a configuration in which the semiconductor chips 60 are mounted on the wiring board 20. The present disclosure is however not limited thereto. For example, an electronic component such as a chip component such as a chip capacitor, a chip resistor or a chip inductor or a crystal resonator may be mounted on the wiring board 20 in place of each semiconductor chip 60.

The mode etc. of mounting the semiconductor chip 60 or the electronic component such as the chip component or the crystal resonator (e.g. flip-chip mounting, wire bonding mounting, solder mounting, a combination of these mountings) etc. can be modified/changed variously.

Arrangement etc. of the via wirings 32 and the wiring layer 31 in the wiring structure 21 according to the aforementioned embodiment can be modified/changed variously.

The number of the wiring layers 41, 43 and 45 and the insulating layers 40, 42, and 44, arrangement of the wirings, etc. in the wiring structure 23 according to the aforementioned embodiment can be modified/changed variously.

The solder resist layer may be formed on the upper surface 44A of the insulating layer 44 according to the aforementioned embodiment.

The surface treatment layer 25 in the wiring board 20 according to the aforementioned embodiment may be omitted.

Although the solder resist layer 22 is illustrated as an example of a protective insulating layer which is the outermost layer of the wiring board 20 in the aforementioned embodiment, the protective insulating layer can be formed out of various photosensitive insulating resins.

In the aforementioned embodiment, the sealing resin 70 is formed to expose the back surfaces of the semiconductor chips 60. The present disclosure is not limited thereto. The sealing resin 70 may be formed to cover the back surfaces of the semiconductor chips 60.

Although the aforementioned embodiment is embodied in the manufacturing method for obtaining multiple pieces, the present disclosure may be embodied in a manufacturing method for obtaining one single piece (for taking one piece).

In the aforementioned embodiment, the support substrate 100 is removed after the semiconductor chips 60 are mounted on the wiring board 20 and the sealing resin 70 is formed to seal the semiconductor chips 60. However, the timing for removing the support substrate 100 is not limited thereto. That is, as long as rigidity can be secured sufficiently only by the structure body from which the support substrate 100 has been removed, the timing for removing the support substrate 100 is not limited particularly. For example, the support substrate 100 may be removed immediately after the wiring structure 23 is formed on the upper surface 30A of the insulating layer 30.

In the method for manufacturing the semiconductor device 10 according to the aforementioned embodiment, the step of thinning the semiconductor chips 60 and the sealing resin 70 from the upper surface side may be omitted.

The aforementioned embodiment and the various modifications may be combined appropriately.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method for manufacturing a wiring board, comprising:

a) forming a first wiring layer on a support substrate;

b) forming a first insulating layer on the support substrate to cover an entire side surface and an entire upper surface of the first wiring layer, wherein the first insulating layer is made of an insulating resin including a reinforcing material;

c) forming a through hole penetrating the first insulating layer in a thickness direction of the first insulating layer to expose a portion of the upper surface of the first wiring layer;

d) forming an electrically conductive layer to fill the through hole with the electrically conductive layer and cover an upper surface of the first insulating layer with the electrically conductive layer;

e) polishing the electrically conductive layer formed on the upper surface of the first insulating layer and a portion of the first insulating layer to form a via wiring having an upper end surface exposed from the upper surface of the first insulating layer in the through hole;

f) forming a second wiring structure having an insulating layer and a wiring layer on the upper surface of the first insulating layer;

g) removing the support substrate;

h) thinning the first insulating layer from a lower surface side thereof to expose the side surface of a lower portion of the first wiring layer from the first insulating layer; and i) forming a protective insulating layer on the lower surface of the first insulating layer to cover the side surface of the first wiring layer exposed from the first insulating layer, wherein a wiring density of the second wiring structure is higher than a wiring density of the first wiring layer, and in the step (e), the upper surface of the first insulating layer is polished such that the reinforcing material is positioned on a side of the upper surface of the first insulating layer with respect to a center of the first insulating layer in a thickness direction of the first insulating layer.

2) The method of clause (1), wherein
the step (a) comprises:

a1) forming a metal film to cover an entire upper surface of the support substrate;

a2) forming a metal layer on an upper surface of the metal film; and a3) removing the metal film by etching with the metal layer as a mask, and in the step (h), the metal film is removed simultaneously with the thinning of the first insulating layer.

3) A method for manufacturing a semiconductor device, comprising:

a) forming a first wiring layer on a support substrate;

b) forming a first insulating layer on the support substrate to cover an entire side surface and an entire upper surface of the first wiring layer, wherein the first insulating layer is made of an insulating resin including a reinforcing material;

c) forming a through hole penetrating the first insulating layer in a thickness direction of the first insulating layer to expose a portion of the upper surface of the first wiring layer;

d) forming an electrically conductive layer to fill the through hole with the electrically conductive layer and cover an upper surface of the first insulating layer with the electrically conductive layer;

e) polishing the electrically conductive layer formed on the upper surface of the first insulating layer and a portion of the first insulating layer to form a via wiring having an upper end surface exposed from the upper surface of the first insulating layer in the through hole;

f) forming a second wiring structure having an insulating layer and a wiring layer on the upper surface of the first insulating layer;

g) connecting an electronic component to an outermost wiring layer of the second wiring structure;

h) forming a sealing resin on an upper surface of an outermost insulating layer of the second wiring structure to seal the electronic component;

i) removing the support substrate;

j) thinning the first insulating layer from a lower surface side thereof to expose the side surface of a lower portion of the first wiring layer from the first insulating layer; and k) forming a protective insulating layer on the lower surface of the first insulating layer to cover the side surface of the first wiring layer exposed from the first insulating layer, wherein a wiring density of the second wiring structure is higher than a wiring density of the first wiring layer, and in the step (e), the upper surface of the first insulating layer is polished such that the reinforcing material is positioned on a side of the upper surface of the first insulating layer with respect to a center of the first insulating layer in a thickness direction of the first insulating layer.

What is claimed is:

1. A wiring board comprising:
a first wiring structure comprising:
a first insulating layer made of an insulating resin including a reinforcing material, wherein the first insulating layer is a single layer;
a recess formed in a lower surface of the first insulating layer;
a first wiring layer having an upper portion filling the recess and a lower portion protruding downward from the lower surface of the first insulating layer; and
a via wiring having an upper end surface exposed from an upper surface of the first insulating layer, wherein the via wiring penetrates the first insulating layer in a thickness direction of the first insulating layer and is directly connected to the upper portion of the first wiring layer;
a protective insulating layer formed on the lower surface of the first insulating layer and covering a side surface of the lower portion of the first wiring layer, wherein an upper surface of the protective insulating layer directly contacts the lower surface of the first insulating layer, and a lower surface of the protective insulating layer is opposite to the upper surface of the protective insulating layer and exposed to an outside of the wiring board; and
a second wiring structure having an insulating layer and a wiring layer and formed on the upper surface of the first insulating layer,
wherein
the upper surface of the first insulating layer and the upper end surface of the via wiring are substantially flush with each other,
a wiring density of the second wiring structure is higher than a wiring density of the first wiring structure,
the reinforcing material is positioned between the second wiring structure and a center of the first insulating layer in the thickness direction of the first insulating layer, and
a portion of a lower surface of the first wiring layer is exposed from the protective insulating layer and serves as an external connection pad.

2. The wiring board of claim 1, wherein
a volume ratio of the first wiring layer and the via wiring to the first wiring structure is not less than a volume ratio of the wiring layer of the second wiring structure to the second wiring structure.

3. The wiring board of claim 1, wherein
the reinforcing material is positioned substantially at a center in a thickness direction of a thickness between the lower surface of the first wiring layer and an upper surface of an outermost insulating layer of the second wiring structure.

4. The wiring board of claim 1, wherein
the first insulating layer further has:
a first resin layer portion covering an upper surface of the reinforcing material; and
a second resin layer portion covering a lower surface of the reinforcing material, and
the first resin layer portion is thinner than the second resin layer portion.

5. The wiring board of claim 4, wherein
entire surfaces of the reinforcing material are covered with the first resin layer portion and the second resin layer portion.

6. The wiring board of claim 1, wherein
a plurality of the recess is formed in the lower surface of the first insulating layer,
the first wiring layer has a plurality of wiring patterns and a plurality of dummy patterns which are formed in a region where the plurality of wiring patterns are not formed, each of the plurality of wiring patterns and plurality of dummy patterns having an upper portion filled in a respective recess, and a lower portion protruding downward from the lower surface of the first insulating layer.

7. The wiring board of claim 1, wherein the upper surface of the protective insulating layer directly contacts a portion of the lower surface of the first wiring layer other than the portion of the lower surface of the first wiring layer exposed from the protective insulating layer.

8. A semiconductor device comprising:
a first wiring structure comprising:
a first insulating layer made of an insulating resin containing a reinforcing material therein, wherein the first insulating layer is a single layer;
a recess formed in a lower surface of the first insulating layer;

a first wiring layer having an upper portion filling the recess and a lower portion protruding downward from the lower surface of the first insulating layer; and a via wiring having an upper end surface exposed from an upper surface of the first insulating layer, wherein the via wiring penetrates the first insulating layer in a thickness direction of the first insulating layer and is directly connected to the upper portion of the first wiring layer;

a protective insulating layer formed on the lower surface of the first insulating layer and covering a side surface of the lower portion of the first wiring layer, wherein an upper surface of the protective insulating layer directly contacts the lower surface of the first insulating layer, and a lower surface of the protective insulating layer is opposite to the upper surface of the protective insulating layer and exposed to an outside of the wiring board;

a second wiring structure having an insulating layer and a wiring layer and formed on the upper surface of the first insulating layer;

an electronic component which is connected to an uppermost wiring layer of the second wiring structure; and a sealing resin formed on an upper surface of an uppermost insulating layer of the second wiring structure to seal the electronic component, wherein the upper surface of the first insulating layer and the upper end surface of the via wiring are substantially flush with each other, a wiring density of the second wiring structure is higher than a wiring density of the first wiring structure, the reinforcing material is positioned between the second wiring structure and a center of the first insulating layer in the thickness direction of the first insulating layer, and a portion of a lower surface of the first wiring layer is exposed from the protective insulating layer and serves as an external connection pad.

9. The semiconductor device according to claim 8, wherein the upper surface of the protective insulating layer directly contacts a portion of the lower surface of the first wiring layer other than the portion of the lower surface of the first wiring layer exposed from the protective insulating layer.

\* \* \* \* \*